(12) United States Patent
Huang

(10) Patent No.: US 11,942,514 B2
(45) Date of Patent: Mar. 26, 2024

(54) SEMICONDUCTOR DEVICE

(71) Applicant: NANYA TECHNOLOGY CORPORATION, New Taipei (TW)

(72) Inventor: Tse-Yao Huang, Taipei (TW)

(73) Assignee: NANYA TECHNOLOGY CORPORATION, New Taipei (TW)

(*) Notice: Subject to any disclaimer, the term of this patent is extended or adjusted under 35 U.S.C. 154(b) by 0 days.

(21) Appl. No.: 18/118,821

(22) Filed: Mar. 8, 2023

(65) Prior Publication Data

US 2023/0223440 A1 Jul. 13, 2023

Related U.S. Application Data

(62) Division of application No. 17/534,779, filed on Nov. 24, 2021, now Pat. No. 11,631,738, which is a division of application No. 16/674,312, filed on Nov. 5, 2019, now Pat. No. 11,309,387.

(51) Int. Cl.
*H01L 29/06* (2006.01)
*H01L 25/00* (2006.01)
*H01L 25/07* (2006.01)

(52) U.S. Cl.
CPC ........ *H01L 29/0692* (2013.01); *H01L 25/072* (2013.01); *H01L 25/50* (2013.01)

(58) Field of Classification Search
CPC ... H01L 25/072; H01L 25/50; H01L 29/0692; H01L 29/165; H01L 29/6659; H01L 21/82345; H01L 21/823462; H01L 29/7833; H01L 29/513; H01L 27/088
See application file for complete search history.

(56) References Cited

U.S. PATENT DOCUMENTS

| | | | | |
|---|---|---|---|---|
| 11,309,387 B2* | 4/2022 | Huang | ............... | H01L 29/7833 |
| 2010/0155854 A1* | 6/2010 | Stahrenberg | ...... | H01L 29/40114 |
| | | | | 257/E27.06 |
| 2010/0308418 A1* | 12/2010 | Stahrenberg | .... | H01L 21/823857 |
| | | | | 257/E21.632 |
| 2013/0007678 A1* | 1/2013 | Yang | ............... | H01L 21/82385 |
| | | | | 257/E27.06 |
| 2021/0118874 A1* | 4/2021 | Huang | ............... | H01L 29/4236 |

* cited by examiner

*Primary Examiner* — Thanh Y. Tran
(74) *Attorney, Agent, or Firm* — Xuan Zhang

(57) ABSTRACT

The present application discloses a semiconductor device including a substrate; a first semiconductor stack having a first threshold voltage and comprising a first insulating stack positioned on the substrate; a second semiconductor stack having a second threshold voltage and comprising a second insulating stack positioned on the substrate; and wherein the first threshold voltage is different the second threshold voltage; a thickness of the first insulating stack is different from a thickness of the second insulating stack.

13 Claims, 36 Drawing Sheets

SEMICONDUCTOR DEVICE

CROSS-REFERENCE TO RELATED APPLICATION

This application is a divisional application of U.S. Non-Provisional application Ser. No. 17/534,779 file on Nov. 24, 2021, which is a divisional application of U.S. Non-Provisional application Ser. No. 16/674,312 filed on Nov. 5, 2019, which is incorporated herein by reference in its entirety.

TECHNICAL FIELD

The present disclosure relates to a semiconductor device and a method for fabricating the semiconductor device, and more particularly, to a semiconductor device with multiple threshold voltages and a method for fabricating the semiconductor device with multiple threshold voltages.

DISCUSSION OF THE BACKGROUND

Semiconductor devices are used in a variety of electronic applications, such as personal computers, cellular telephones, digital cameras, and other electronic equipment. In addition, demand for more sophisticated designs of semiconductor devices is rising.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor device including a substrate, a first semiconductor stack having a first threshold voltage and comprising a first insulating stack positioned on the substrate, a second semiconductor stack having a second threshold voltage and comprising a second insulating stack positioned on the substrate, and a third semiconductor stack having a third threshold voltage and comprising a third insulating stack positioned on the substrate. The first threshold voltage, the second threshold voltage, and the third threshold voltage are different from each other; a thickness of the first insulating stack is different from a thickness of the second insulating stack and a thickness of the third insulating stack, and the thickness of the second insulating stack is different from the thickness of the third insulating stack.

In some embodiments, the first insulating stack comprises a first bottom insulating layer positioned on the substrate, and the third insulating stack comprises a third bottom insulating layer positioned on the substrate and a third top insulating layer positioned on the third bottom insulating layer.

In some embodiments, the second insulating stack comprises a second bottom insulating layer positioned on the substrate, a second middle insulating layer positioned on the second bottom insulating layer, and a second top insulating layer positioned on the second middle insulating layer.

In some embodiments, the first semiconductor stack further comprises a first bottom conductive layer positioned on the first bottom insulating layer.

In some embodiments, the first semiconductor stack further comprises a first top conductive layer positioned on the first bottom conductive layer.

In some embodiments, the first semiconductor stack further comprises a first filler layer positioned on the first top conductive layer, and the first filler layer is formed of tungsten or aluminum.

In some embodiments, the second semiconductor stack further comprises a second bottom conductive layer positioned on the second top insulating layer.

In some embodiments, the second semiconductor stack further comprises a second top conductive layer positioned on the second bottom conductive layer.

In some embodiments, the semiconductor device further comprises: a first pair of inner spacers attached to two sides of the first semiconductor stack.

In some embodiments, the semiconductor device further comprises: a first pair of outer spacers attached to outer surfaces of the first pair of inner spacers.

In some embodiments, the semiconductor device further comprises: two first lightly-doped regions positioned adjacent to the first semiconductor stack and in the substrate.

In some embodiments, the semiconductor device further comprises: two first heavily-doped regions positioned adjacent to the first pair of inner spacers and in the substrate.

In some embodiments, the semiconductor device further comprises: a third pair of stress regions positioned adjacent to the third semiconductor stack, wherein lower portions of the third pair of stress regions are positioned in the substrate and upper portions of the third pair of stress regions protrude from a top surface of the substrate.

In some embodiments, the second semiconductor stack further comprises a second functional layer positioned between the second top insulating layer and the second bottom conductive layer, and the second functional layer has a thickness between about 10 angstroms and about 15 angstroms.

In some embodiments, the second semiconductor stack further comprises a second dipole layer positioned between the substrate and the second bottom insulating layer, and the second dipole layer is formed of a material including one or more of lutetium oxide, lutetium silicon oxide, yttrium oxide, yttrium silicon oxide, lanthanum oxide, lanthanum silicon oxide, barium oxide, and barium silicon oxide.

In some embodiments, the second semiconductor stack further comprises a second protection layer positioned between the second top insulating layer and the second bottom conductive layer, and the second protection layer is formed of titanium nitride.

In some embodiments, the second semiconductor stack further comprises a second encapsulation layer positioned between the second filler layer and the second bottom conductive layer, and the second encapsulation layer has a thickness between about 15 angstroms and about 25 angstroms.

Another aspect of the present disclosure provides a method for fabricating a semiconductor device including providing a substrate and forming a first semiconductor stack, a second semiconductor stack, and a third semiconductor stack on the substrate. The first semiconductor stack comprises a first insulating stack, the second semiconductor stack comprises a second insulating stack, and the third semiconductor stack comprises a third insulating stack. Thicknesses of the first insulating stack, the second insulating stack, and the third insulating stack are all different.

In some embodiments, the method for fabricating the semiconductor device further comprises: forming a first pair of inner spacers attached to two sides of the first semiconductor stack.

In some embodiments, the method for fabricating the semiconductor device further comprises: forming two first heavily-doped regions adjacent to the first pair of inner spacers and in the substrate.

Due to the design of the design of the semiconductor device of the present disclosure, the first semiconductor stack, the second semiconductor stack, and the third semiconductor stack may have different threshold voltages and may provide different functions; therefore, the applicability of the semiconductor device may be increased. In addition, the carrier mobility of the semiconductor device may be improved due to presence of pairs of stress regions. Furthermore, the threshold voltages of the semiconductor device may be fine-tuned using the adjustment layers.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
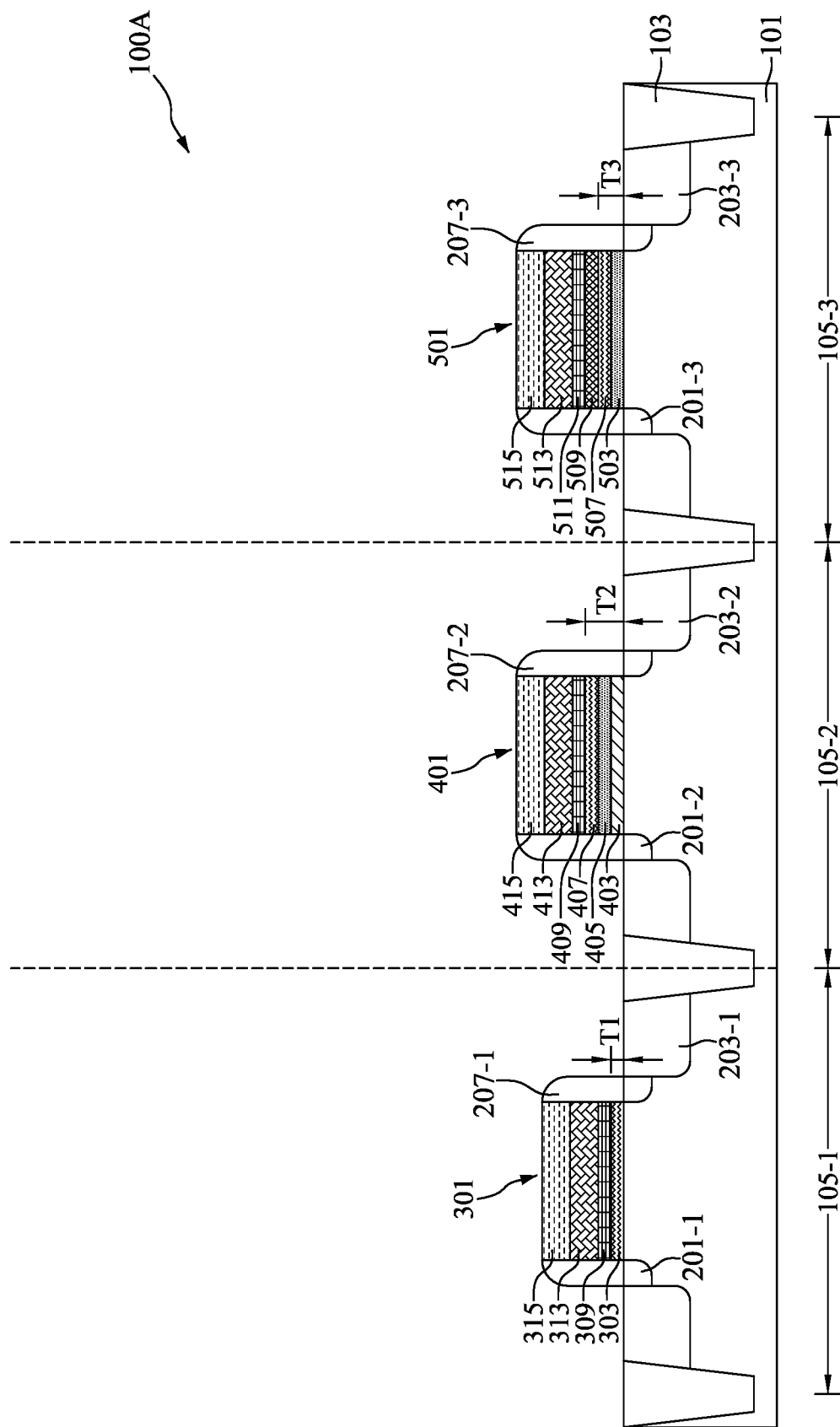
FIG. 1 illustrates, in a schematic cross-sectional view diagram, a semiconductor device in accordance with one embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

It should be understood that when an element or layer is referred to as being "connected to," or "coupled to" another element or layer, it can be directly connected to or coupled to another element or layer or intervening elements or layers may be present.

It should be understood that, although the terms first, second, etc. may be used herein to describe various elements, these elements should not be limited by these terms. Unless indicated otherwise, these terms are only used to distinguish one element from another element. Thus, for example, a first element, a first component or a first section discussed below could be termed a second element, a second component or a second section without departing from the teachings of the present disclosure.

Unless the context indicates otherwise, terms such as "same," "equal," "planar," or "coplanar," as used herein when referring to orientation, layout, location, shapes, sizes, amounts, or other measures, do not necessarily mean an exactly identical orientation, layout, location, shape, size, amount, or other measure, but are intended to encompass nearly identical orientation, layout, location, shapes, sizes, amounts, or other measures within acceptable variations that may occur, for example, due to manufacturing processes. The term "substantially" may be used herein to reflect this meaning. For example, items described as "substantially the same," "substantially equal," or "substantially planar," may be exactly the same, equal, or planar, or may be the same, equal, or planar within acceptable variations that may occur, for example, due to manufacturing processes.

In the present disclosure, a semiconductor device generally means a device which can function by utilizing semiconductor characteristics, and an electro-optic device, a light-emitting display device, a semiconductor circuit, and an electronic device are all included in the category of the semiconductor device. A semiconductor stack with a lower threshold voltage may have a faster switching speed and may be suitable for providing computational logic functions. In contrast, a semiconductor stack with a high threshold voltage may decrease power consumption of the semiconductor stack and may be suitable to implement in storage functions. Therefore, a semiconductor device with semiconductor stacks with multiple threshold voltages may have broader applicability than a semiconductor device with only a single threshold voltage.

It should be noted that, in the description of the present disclosure, above (or up) corresponds to the direction of the arrow of the direction Z, and below (or down) corresponds to the opposite direction of the arrow of the direction Z.

Figure 2:
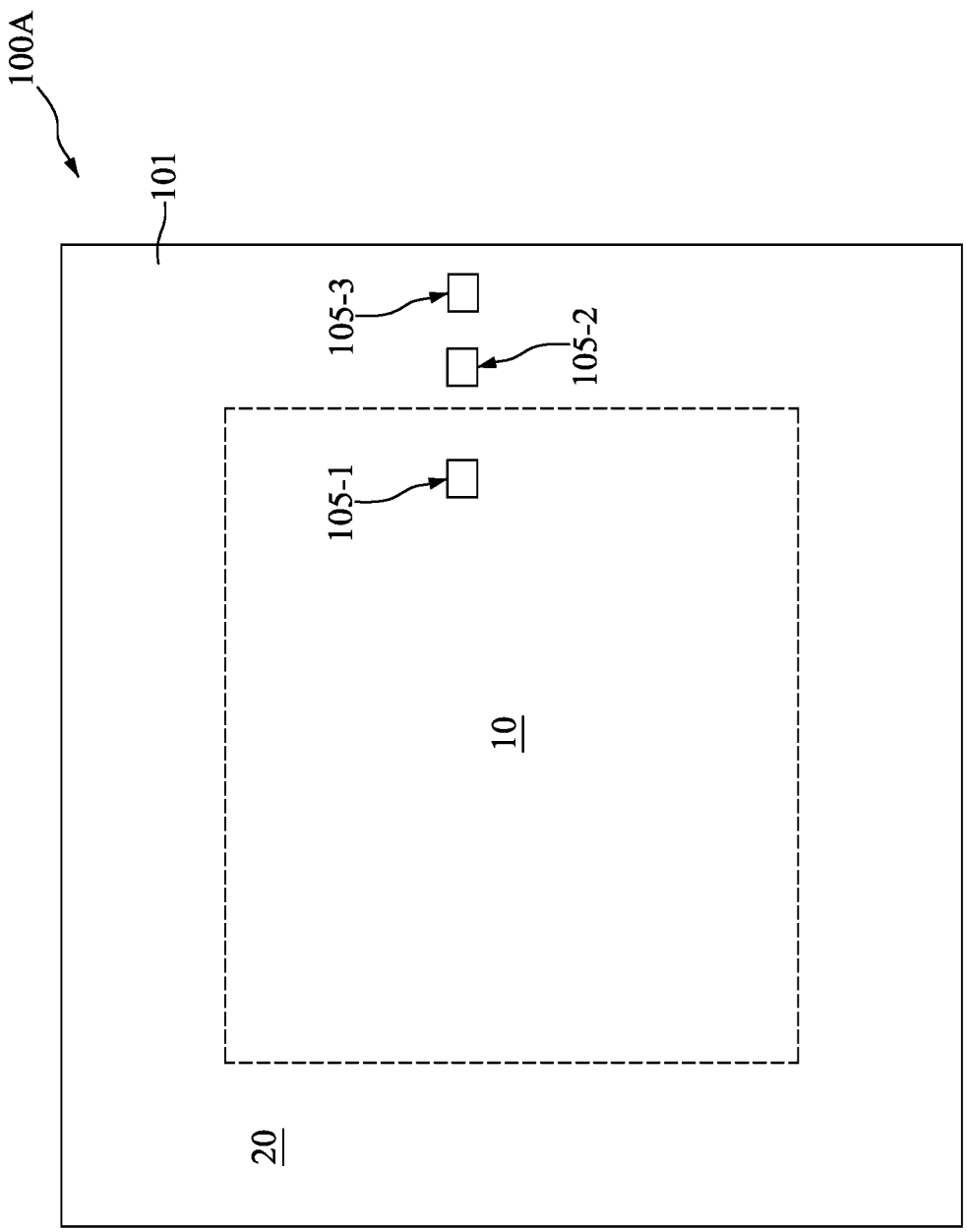
FIG. 2 illustrates, in a schematic top-view diagram, the semiconductor device in accordance with one embodiment of the present disclosure.

FIG. 1 illustrates, in a schematic cross-sectional view diagram, a semiconductor device 100A in accordance with one embodiment of the present disclosure. FIG. 2 illustrates, in a schematic top-view diagram, the semiconductor device 100A in accordance with one embodiment of the present disclosure.

With reference to FIGS. 1 and 2, in the embodiment depicted, the semiconductor device 100A may include a substrate 101, an isolation layer 103, a plurality of doped regions, a plurality of spacers, a first semiconductor stack 301, a second semiconductor stack 401, and a third semiconductor stack 501.

With reference to FIGS. 1 and 2, in the embodiment depicted, the substrate 101 may include an array area 10 and a peripheral area 20. The array area 10 may be in the center of the substrate 101. The peripheral area 20 may surround the array area 10. The substrate 101 may be formed of, for example, silicon, germanium, silicon germanium, silicon carbon, silicon germanium carbon, gallium, gallium arsenic, indium arsenic, indium phosphorus or other IV-IV, III-V or II-VI semiconductor materials. The substrate 101 may have a first lattice constant and a crystal orientation <100>.

Alternatively, in another embodiment, the substrate 101 may include an organic semiconductor or a layered semiconductor such as silicon/silicon germanium, silicon-on-insulator or silicon germanium-on-insulator. When the substrate 101 is formed of silicon-on-insulator, the substrate 101 may include a top semiconductor layer and a bottom semiconductor layer formed of silicon, and a buried insulating layer that may separate the top semiconductor layer from the bottom semiconductor layer. The buried insulating layer may include, for example, a crystalline or non-crystalline oxide, nitride or any combination thereof.

With reference to FIGS. 1 and 2, in the embodiment depicted, the isolation layer 103 may be disposed in the substrate 101. Specifically, the isolation layer 103 may be disposed in an upper portion of the substrate 101. The isolation layer 103 may define a first active region 105-1, a second active region 105-2, and a third active region 105-3 separated from each other. The first active region 105-1 may be located at the array area 10 of the substrate 101. The second active region 105-2 and the third active region 105-3 may be located at the peripheral area 20 of the substrate 101. Alternatively, in another embodiment, the first active region 105-1, the second active region 105-2, and the third active region 105-3 may be all located at the array area 10 or all located at the peripheral area 20, but are not limited thereto. Alternatively, in another embodiment, the first active region 105-1, the second active region 105-2, and the third active region 105-3 may be connected to each other. The isolation layer 103 may be formed of, for example, an insulating material such as silicon oxide, silicon nitride, silicon oxynitride, silicon nitride oxide, or fluoride-doped silicate.

It should be noted that, in the present disclosure, silicon oxynitride refers to a substance which contains silicon, nitrogen, and oxygen and in which a proportion of oxygen is greater than that of nitrogen. Silicon nitride oxide refers to a substance which contains silicon, oxygen, and nitrogen and in which a proportion of nitrogen is greater than that of oxygen.

With reference to FIGS. 1 and 2, in the embodiment depicted, the plurality of doped regions may be disposed in the substrate 101 and may include two first lightly-doped regions 201-1, two second lightly-doped regions 201-2, two third lightly-doped regions 201-3, two first heavily-doped regions 203-1, two second heavily-doped regions 203-2, and two third heavily-doped regions 203-3. The plurality of spacers may include a first pair of inner spacers 207-1, a second pair of inner spacers 207-2, and a third pair of inner spacers 207-3. The plurality of spacers may be formed of, for example, silicon oxide, silicon nitride, polysilicon, or the like.

With reference to FIGS. 1 and 2, in the embodiment depicted, the first semiconductor stack 301 may be disposed on the first active region 105-1. The first semiconductor stack 301 may have a first threshold voltage and may include a first insulating stack, a first bottom conductive layer 309, a first filler layer 313, and a first capping layer 315.

With reference to FIGS. 1 and 2, in the embodiment depicted, the first insulating stack may be disposed on the first active region 105-1 and may include a first bottom insulating layer 303. In other words, the first bottom insulating layer 303 may be disposed on the substrate 101. The first bottom insulating layer 303 may have a thickness between about 0.5 nm and about 5.0 nm. Preferably, the thickness of the first bottom insulating layer 303 may be between about 0.5 nm and about 2.5 nm. It should be noted that the thickness of the first bottom insulating layer 303 may be set to an arbitrary range depending on the circumstances. The two first lightly-doped regions 201-1 may be respectively correspondingly disposed adjacent to two sides of the first bottom insulating layer 303 and in the substrate 101. The two first lightly-doped regions 201-1 may be doped with a dopant such as phosphorus, arsenic, or antimony and have a first electrical type. The two first lightly-doped regions 201-1 may have a dopant concentration between about 1E14 atoms/cm^3 and about 1E16 atoms/cm^3.

The first bottom insulating layer 303 may be formed of, for example, an insulating material having a dielectric constant of about 4.0 or greater. All dielectric constants mentioned herein are relative to a vacuum unless otherwise noted. The insulating material having a dielectric constant of about 4.0 or greater may be hafnium oxide, hafnium zirconium oxide, hafnium lanthanum oxide, hafnium silicon oxide, hafnium tantalum oxide, hafnium titanium oxide, zirconium oxide, aluminum oxide, aluminum silicon oxide, titanium oxide, tantalum pentoxide, lanthanum oxide, lanthanum silicon oxide, strontium titanate, lanthanum aluminate, yttrium oxide, gallium (III) trioxide, gadolinium gallium oxide, lead zirconium titanate, barium titanate, barium strontium titanate, barium zirconate, or a mixture thereof. Alternatively, in another embodiment, the insulating material may be silicon oxide, silicon nitride, silicon oxynitride, silicon nitride oxide, or the like.

With reference to FIGS. 1 and 2, in the embodiment depicted, the first bottom conductive layer 309 may be disposed on the first bottom insulating layer 303. The first bottom conductive layer 309 may have a thickness between about 10 angstroms and about 200 angstroms. Preferably, the thickness of the first bottom conductive layer 309 may be between about 10 angstroms and about 100 angstroms. The first bottom conductive layer 309 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The first filler layer 313 may be disposed on the first bottom conductive layer 309. The first filler layer 313 may be formed of, for example, tungsten or aluminum. The first capping layer 315 may be disposed on the first filler layer 313 and may be formed of, for example, silicon oxide, silicon nitride, silicon oxynitride, silicon nitride oxide, or fluoride-doped silicate.

With reference to FIGS. 1 and 2, in the embodiment depicted, the first pair of inner spacers 207-1 may be respectively correspondingly attached to two sides of the first semiconductor stack 301. Specifically, the first pair of inner spacers 207-1 may be respectively correspondingly attached to sidewalls of the first capping layer 315, sidewalls of the first filler layer 313, sidewalls of the first bottom conductive layer 309, and sidewalls of the first bottom insulating layer 303. Bottoms of the first pair of inner spacers 207-1 may be respectively correspondingly disposed on portions of the two first lightly-doped regions 201-1.

With reference to FIGS. 1 and 2, in the embodiment depicted, the two first heavily-doped regions 203-1 may be respectively correspondingly disposed adjacent to the two first lightly-doped regions 201-1. The two first heavily-doped regions 203-1 may be respectively correspondingly disposed adjacent to the first pair of inner spacers 207-1 and in the substrate 101. The two first heavily-doped regions 203-1 may be doped with a same dopant as the two first lightly-doped regions 201-1 and may have a same electrical type as the two first lightly-doped regions 201-1. The two first heavily-doped regions 203-1 may have a dopant concentration greater than the dopant concentration of the two first lightly-doped regions 201-1.

With reference to FIGS. 1 and 2, in the embodiment depicted, the second semiconductor stack 401 may be disposed on the second active region 105-2 and may include a second insulating stack, a second bottom conductive layer 409, a second filler layer 413, and a second capping layer 415. The second insulating stack may include a second bottom insulating layer 403, a second middle insulating layer 405, and a second top insulating layer 407. The second semiconductor stack 401 may have a second threshold voltage. The second threshold voltage may be greater than the first threshold voltage.

With reference to FIGS. 1 and 2, in the embodiment depicted, the second bottom insulating layer 403 may be disposed on the second active region 105-2. The second bottom insulating layer 403 may have a thickness between about 0.1 nm and about 3.0 nm. Preferably, the thickness of the second bottom insulating layer 403 may be between about 0.5 nm and about 2.5 nm. It should be noted that the thickness of the second bottom insulating layer 403 may be set to an arbitrary range depending on the circumstances. The second bottom insulating layer 403 may be formed of, for example, silicon oxide, silicon nitride, silicon oxynitride, silicon nitride oxide, or the like. Alternatively, in another embodiment, the second bottom insulating layer 403 may be formed of an insulating material having a dielectric constant of about 4.0 or greater. The two second lightly-doped regions 201-2 may be respectively correspondingly disposed adjacent to two sides of the second bottom insulating layer 403 and in the substrate 101. The two second lightly-doped regions 201-2 may be doped with a same dopant as the two first lightly-doped regions 201-1, and may have a same electrical type and a same dopant concentration as the two first lightly-doped regions 201-1, but are not limited thereto.

With reference to FIGS. 1 and 2, in the embodiment depicted, the second middle insulating layer 405 may be disposed on the second bottom insulating layer 403. The second middle insulating layer 405 may have a thickness between about 0.1 nm and about 2.0 nm. Preferably, the thickness of the second middle insulating layer 405 may be between about 0.5 nm and about 1.5 nm. It should be noted that the thickness of the second middle insulating layer 405 may be set to an arbitrary range depending on the circumstances. The second middle insulating layer 405 may be formed of, for example, an insulating material having a dielectric constant of about 4.0 or greater. Alternatively, in another embodiment, the second middle insulating layer 405 may be formed of, for example, silicon oxide, silicon nitride, silicon oxynitride, silicon nitride oxide, or the like.

With reference to FIGS. 1 and 2, in the embodiment depicted, the second top insulating layer 407 may be disposed on the second middle insulating layer 405. The second top insulating layer 407 may have a same thickness as the first bottom insulating layer 303, but is not limited thereto. The second top insulating layer 407 may be formed of a same material as the first bottom insulating layer 303, but is not limited thereto. The second bottom conductive layer 409 may be disposed on the second top insulating layer 407 and may have a same thickness as the first bottom conductive layer 309, but is not limited thereto. The second bottom conductive layer 409 may be formed of a same material as the first bottom conductive layer 309, but is not limited thereto.

With reference to FIGS. 1 and 2, in the embodiment depicted, the second filler layer 413 may be disposed on the second bottom conductive layer 409. The second filler layer 413 may be formed of a same material as the first filler layer 313, but is not limited thereto. The second capping layer 415 may be disposed on the second filler layer 413. The second capping layer 415 may be formed of a same material as the first capping layer 315, but is not limited thereto. The second pair of inner spacers 207-2 may be respectively correspondingly attached to two sides of the second semiconductor stack 401. Specifically, the second pair of inner spacers 207-2 may be respectively correspondingly attached to sidewalls of the second capping layer 415, sidewalls of the second filler layer 413, sidewalls of the second bottom conductive layer 409, sidewalls of the second top insulating layer 407, sidewalls of the second middle insulating layer 405, and sidewalls of the second bottom insulating layer 403. Bottoms of the second pair of inner spacers 207-2 may be respectively correspondingly disposed on portions of the two second lightly-doped regions 201-2.

With reference to FIGS. 1 and 2, in the embodiment depicted, the two second heavily-doped regions 203-2 may be respectively correspondingly disposed adjacent to the two second lightly-doped regions 201-2. The two second heavily-doped regions 203-2 may be respectively correspondingly disposed adjacent to the second pair of inner spacers 207-2 and in the substrate 101. The two second heavily-doped regions 203-2 may be doped with a same dopant as the two second lightly-doped regions 201-2 and may have a same electrical type as the two second lightly-doped regions 201-2. The two second heavily-doped regions 203-2 may have a dopant concentration greater than the dopant concentration of the two second lightly-doped regions 201-2.

With reference to FIGS. 1 and 2, in the embodiment depicted, the third semiconductor stack 501 may be disposed on the third active region 105-3 and may include a third insulating stack, a third bottom conductive layer 509, a third top conductive layer 511, a third filler layer 513, and third capping layer 515. The third insulating stack may include a third bottom insulating layer 503 and a third top insulating layer 507. The third semiconductor stack 501 may have a third threshold voltage. The third threshold voltage may be greater than the first threshold voltage and less than the second threshold voltage.

With reference to FIGS. 1 and 2, in the embodiment depicted, the third bottom insulating layer 503 may be disposed on the third active region 105-3. The third bottom insulating layer 503 may have a same thickness as the second middle insulating layer 405, but is not limited thereto. It should be noted that the thickness of the third bottom insulating layer 503 may be set to an arbitrary range depending on the circumstances. The third bottom insulating layer 503 may be formed of a same material as the second middle insulating layer 405, but is not limited thereto. The two third lightly-doped regions 201-3 may be respectively correspondingly disposed adjacent to two sides of the third bottom insulating layer 503 and in the substrate 101. The two third lightly-doped regions 201-3 may be doped with a dopant such as boron and may have a second electrical type which may be different from the first electrical type. The two third lightly-doped regions 201-3 may have a dopant concentration between about $1E14$ atoms/cm$^3$ and about $1E16$ atoms/cm$^3$.

With reference to FIGS. 1 and 2, in the embodiment depicted, the third top insulating layer 507 may be disposed on the third bottom insulating layer 503. The third top insulating layer 507 may have a same thickness as the second top insulating layer 407, but is not limited thereto. The third top insulating layer 507 may be formed of a same material as the second top insulating layer 407, but is not limited thereto. The third bottom conductive layer 509 may be disposed on the third top insulating layer 507. The third bottom conductive layer 509 may have a thickness between about 10 angstroms and about 100 angstroms. The third bottom conductive layer 509 may be formed of, for example, titanium nitride, tantalum nitride, tantalum carbide, tungsten nitride, or ruthenium.

With reference to FIGS. 1 and 2, in the embodiment depicted, the third top conductive layer 511 may be disposed on the third bottom conductive layer 507. The third top conductive layer 511 may have a same thickness as the second bottom conductive layer 409, but is not limited thereto. The third top conductive layer 511 may be formed of a same material as the second bottom conductive layer 409, but is not limited thereto. The third filler layer 513 may be disposed on the third top conductive layer 511. The third filler layer 513 may be formed of a same material as the second filler layer 413, but is not limited thereto. The third capping layer 515 may be disposed on the third filler layer 513 and may be formed of a same material as the second capping layer 415, but is not limited thereto.

With reference to FIGS. 1 and 2, in the embodiment depicted, the third pair of inner spacers 207-3 may be respectively correspondingly attached to two sides of the third semiconductor stack 501. Specifically, the third pair of inner spacers 207-3 may be respectively correspondingly attached to sidewalls of the third capping layer 515, sidewalls of the third filler layer 513, sidewalls of the third top conductive layer 511, sidewalls of the third bottom conductive layer 509, sidewalls of the third top insulating layer 507, and sidewalls of the third bottom insulating layer 503. Bottoms of the third pair of inner spacers 207-3 may be respectively correspondingly disposed on portions of the two third lightly-doped regions 201-3.

With reference to FIGS. 1 and 2, in the embodiment depicted, the two second heavily-doped regions 203-3 may be respectively correspondingly disposed adjacent to the two third lightly-doped regions 201-3. The two second heavily-doped regions 203-3 may be respectively correspondingly disposed adjacent to the third pair of inner spacers 207-3 and in the substrate 101. The two second heavily-doped regions 203-3 may be doped with a same dopant as the two third lightly-doped regions 201-3 and may have a same electrical type as the two third lightly-doped regions 201-3. The two second heavily-doped regions 203-3 may have a dopant concentration greater than the dopant concentration of the two third lightly-doped regions 201-3.

With reference to FIGS. 1 and 2, in the embodiment depicted, the first insulating stack may have a thickness T1, which may be equal to the thickness of the first bottom insulating layer 303. The second insulating stack may have a thickness T2, which may be equal to a sum of the thicknesses of the second top insulating layer 407, the second middle insulating layer 405, and the second bottom insulating layer 403. The third insulating stack may have a thickness T3, which may be equal to a sum of the thicknesses of the third top insulating layer 507 and the third bottom insulating layer 503. The thickness T2 may be greater than the thickness T3 and the thickness T1. The thickness T2 may be greater than the thickness T1. The threshold voltage may be proportional to the thickness of the insulating stack; hence, the second threshold voltage of the second semiconductor stack 401 including the second insulating stack may be greater than the third threshold voltage of the third semiconductor stack 501 including the third insulating stack and the first threshold voltage of the first semiconductor stack 301 including the first insulating stack. Accordingly, the third threshold voltage of the third semiconductor stack 501 including the third insulating stack may be greater than the first threshold voltage of the first semiconductor stack 301 including the first insulating stack.

Figure 3:
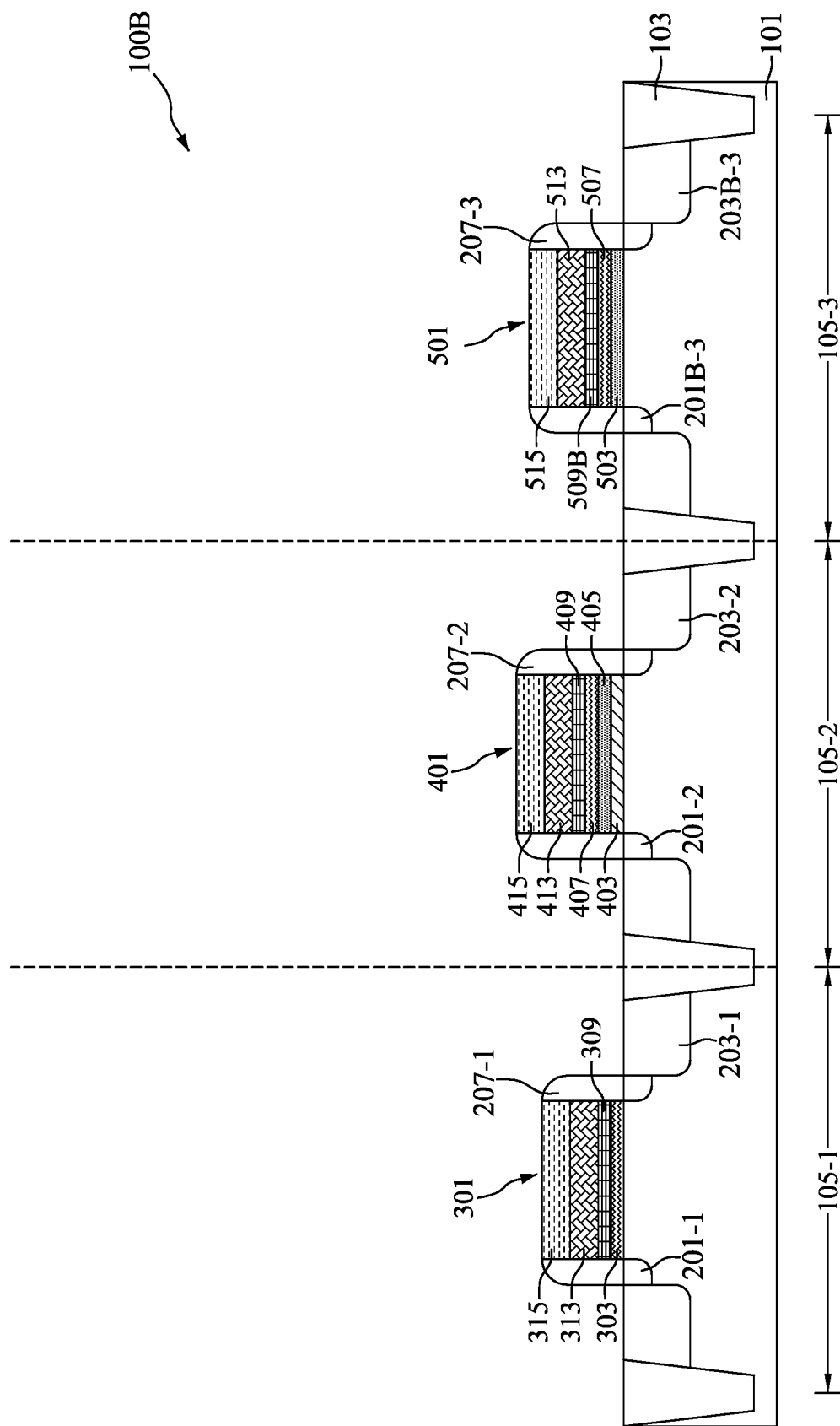
FIGS. 3 to 11 illustrate, in schematic cross-sectional view diagrams, semiconductor devices in accordance with other embodiments of the present disclosure.

FIG. 3 illustrates, in a schematic cross-sectional view diagram, a semiconductor device 100B in accordance with another embodiment of the present disclosure.

With reference to FIG. 3 and in comparison to FIG. 1, the two third lightly-doped regions 201B-3 and the two second heavily-doped regions 203B-3 may be doped with a dopant such as phosphorus, arsenic, or antimony and may have the first electrical type, which is the same as the electrical type of the two first lightly-doped regions 201-1. The third bottom conductive layer 509B may be disposed on the third top insulating layer 507. The third bottom conductive layer 509B may have a same thickness as the second bottom conductive layer 409, but is not limited thereto. The third bottom conductive layer 509B may be formed of a same material as the second bottom conductive layer 409, but is not limited thereto. The third filler layer 513 may be disposed on the third bottom conductive layer 509B.

Figure 4:
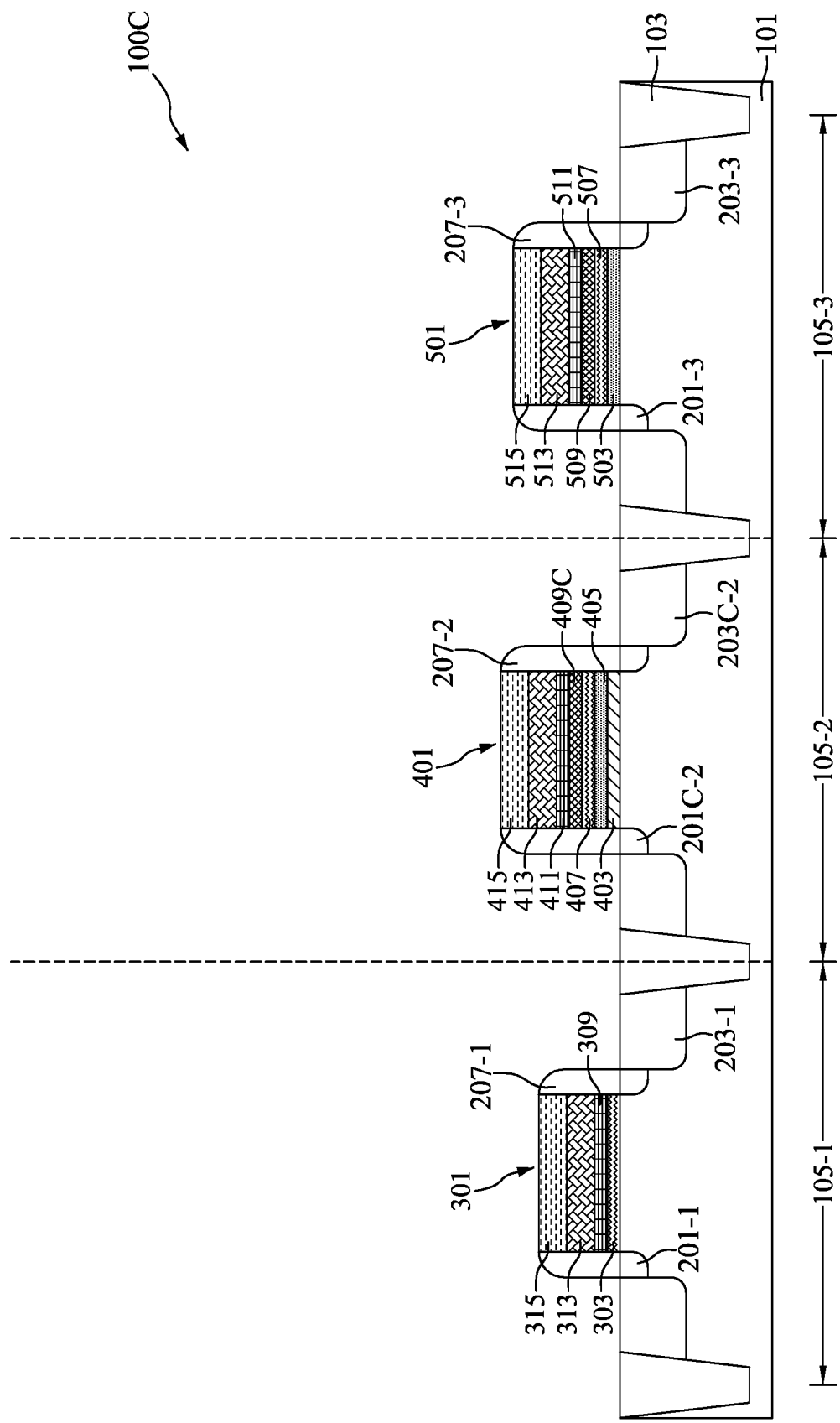

FIG. 4 illustrates, in a schematic cross-sectional view diagram, a semiconductor device 100C in accordance with another embodiment of the present disclosure.

With reference to FIG. 4 and in comparison to FIG. 1, the two second lightly-doped regions 201C-2 and the two second heavily-doped regions 203C-2 may be doped with a dopant such as boron and may have the second electrical type, which is the same as the electrical type of the two third lightly-doped regions 201-3. The second semiconductor stack 401 may include a second top conductive layer 411. The second bottom conductive layer 409C may be disposed on the second top insulating layer 407. The second bottom conductive layer 409C may have a thickness between about 10 angstroms and about 100 angstroms. The second bottom conductive layer 409C may be formed of, for example, titanium nitride, tantalum nitride, tantalum carbide, tungsten nitride, or ruthenium. The second top conductive layer 411 may be disposed on the second bottom conductive layer 409C and may have a same thickness as the first bottom conductive layer 309, but is not limited thereto. The second top conductive layer 411 may be formed of a same material as the first bottom conductive layer 309, but is not limited thereto. The second filler layer 413 may be disposed on the second top conductive layer 411.

Figure 5:
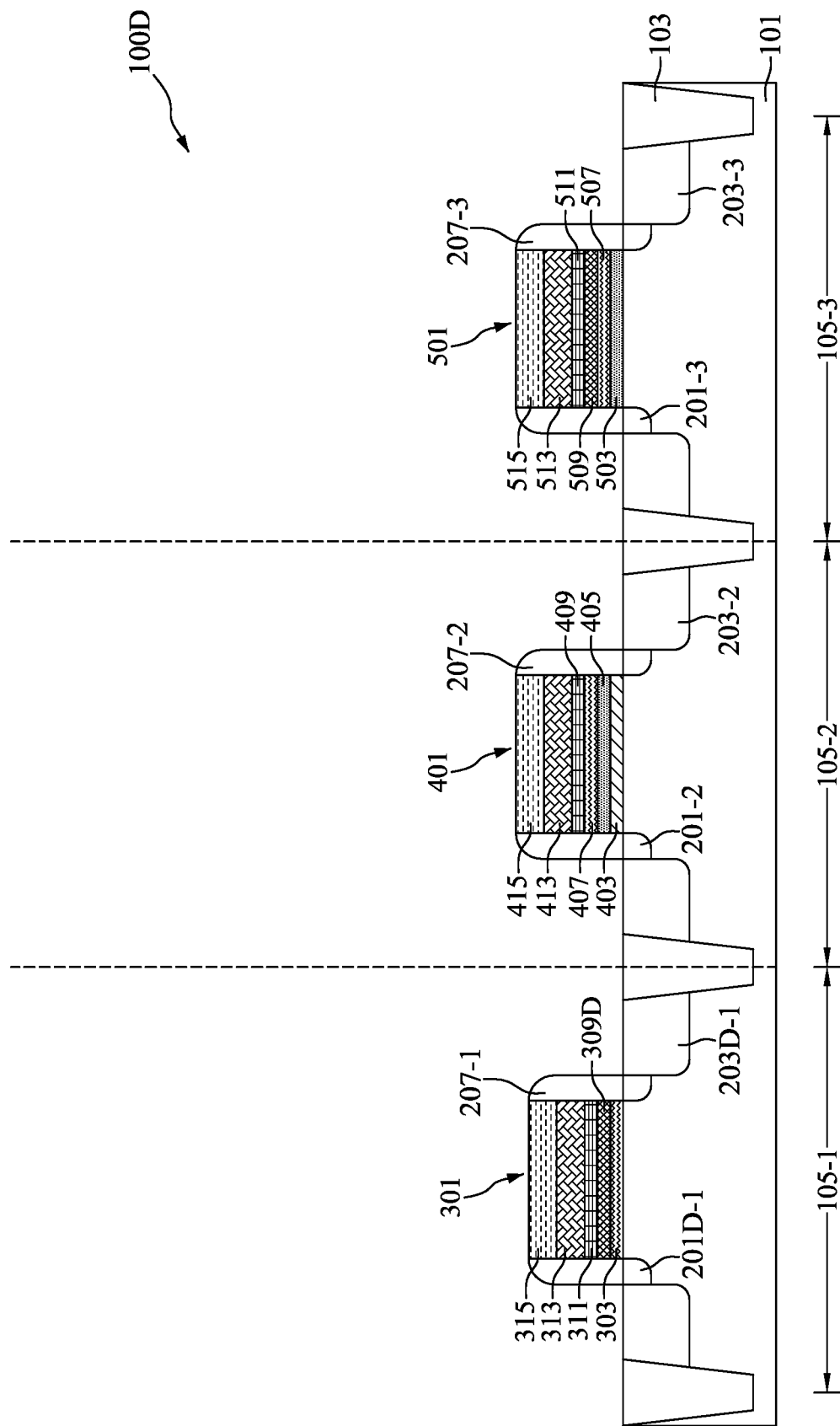

FIG. 5 illustrates, in a schematic cross-sectional view diagram, a semiconductor device 100D in accordance with another embodiment of the present disclosure.

With reference to FIG. 5 and in comparison to FIG. 1, the two first lightly-doped regions 201D-1 and the two first heavily-doped regions 203D-1 may be doped with a dopant such as boron and may have the second electrical type, which is the same as the electrical type of the two third lightly-doped regions 201-3. The first semiconductor stack 301 may include a first top conductive layer 311. The first bottom conductive layer 309D may be disposed on the first bottom insulating layer 303. The first bottom conductive layer 309D may have a thickness between about 10 angstroms and about 100 angstroms. The first bottom conductive layer 309D may be formed of, for example, titanium nitride, tantalum nitride, tantalum carbide, tungsten nitride, or ruthenium. The first top conductive layer 311 may be disposed on the first bottom conductive layer 309D and may have a thickness between about 10 angstroms and about 200 angstroms. Preferably, the thickness of the first top conductive layer 311 may be between about 10 angstroms and about 100 angstroms. The first top conductive layer 311 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. The first filler layer 313 may be disposed on the first top conductive layer 311.

Figure 6:
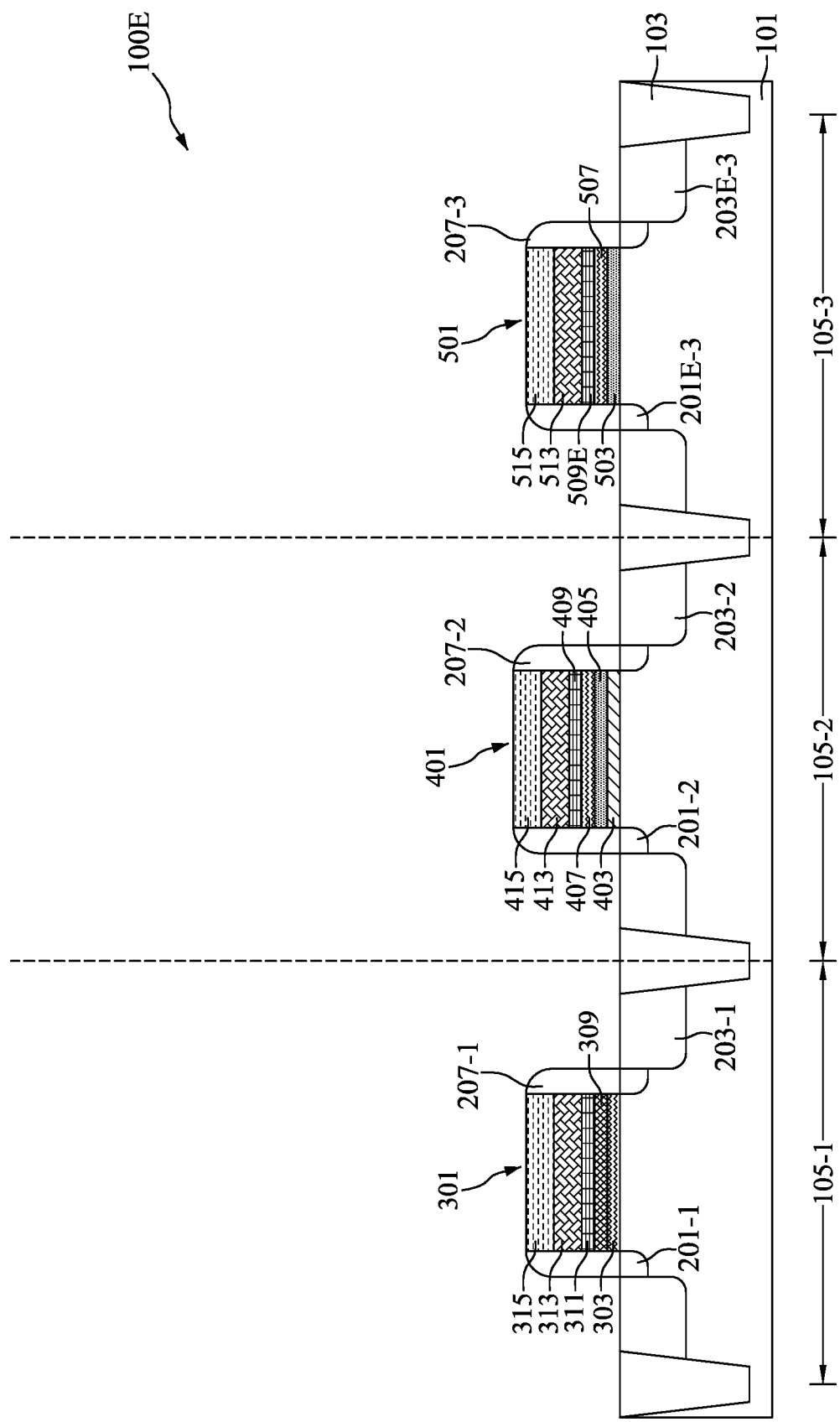

FIG. 6 illustrates, in a schematic cross-sectional view diagram, a semiconductor device 100E in accordance with another embodiment of the present disclosure.

With reference to FIG. 6 and in comparison to FIG. 5, the two third lightly-doped regions 201E-3 and the two second heavily-doped regions 203E-3 may be doped with a dopant such as phosphorus, arsenic, or antimony and may have the first electrical type, which is the same as the electrical type of the two second lightly-doped regions 201-2. The third bottom conductive layer 509E may be disposed on the third top insulating layer 507. The third bottom conductive layer 509E may have a same thickness as the second bottom conductive layer 409, but is not limited thereto. The third bottom conductive layer 509E may be formed of a same material as the second bottom conductive layer 409, but is not limited thereto. The third filler layer 513 may be disposed on the third bottom conductive layer 509E.

Figure 7:
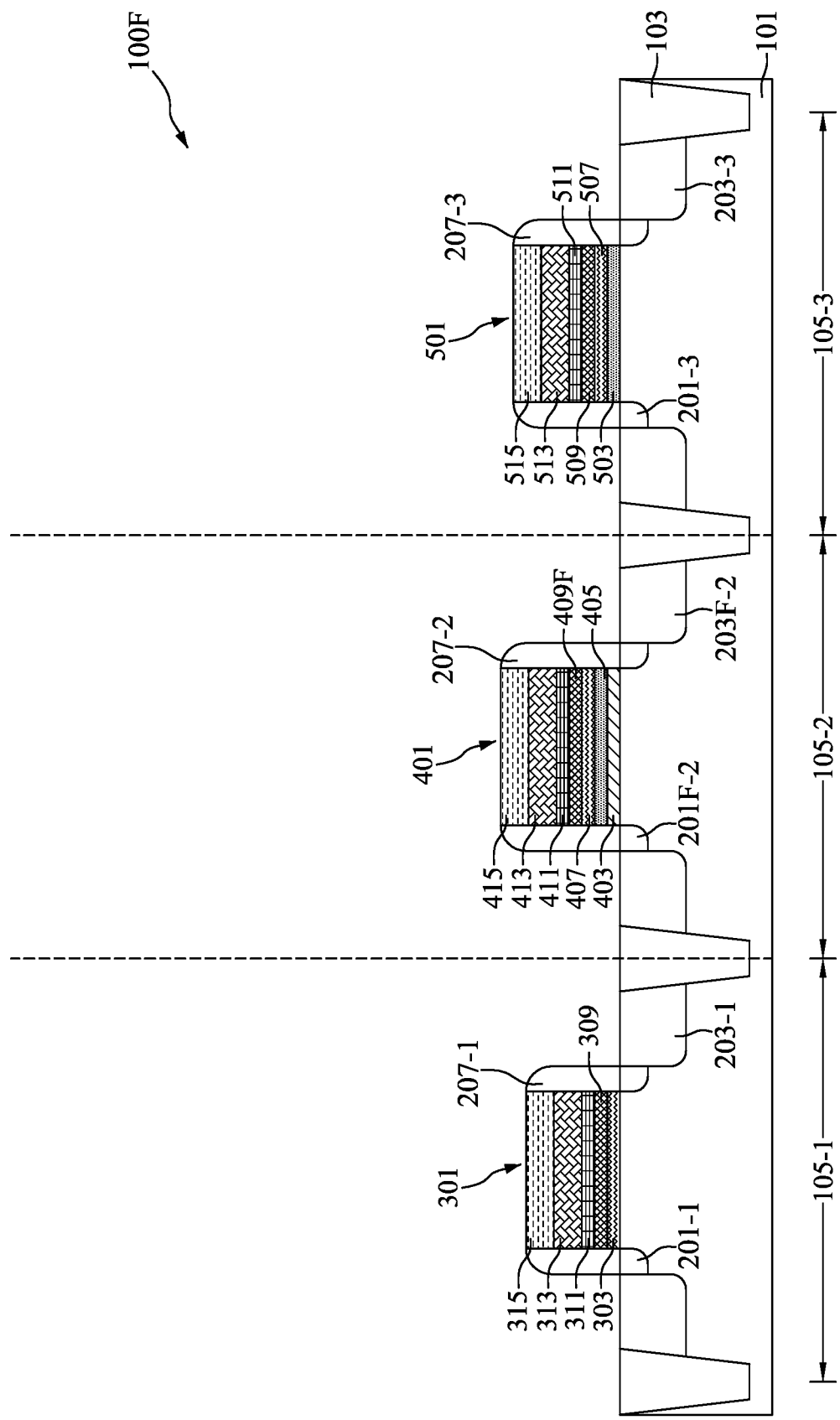

FIG. 7 illustrates, in a schematic cross-sectional view diagram, a semiconductor device 100F in accordance with another embodiment of the present disclosure.

With reference to FIG. 7 and in comparison to FIG. 5, the two second lightly-doped regions 201F-2 and the two second heavily-doped regions 203F-2 may be doped with a dopant such as boron and may have the second electrical type, which is the same as the electrical type of the two third lightly-doped regions 201-3. The second semiconductor stack 401 may include a second top conductive layer 411. The second bottom conductive layer 409F may be disposed on the second top insulating layer 407. The second bottom conductive layer 409F may have a thickness between about 10 angstroms and about 100 angstroms. The second bottom conductive layer 409F may be formed of, for example, titanium nitride, tantalum nitride, tantalum carbide, tungsten nitride, or ruthenium. The second top conductive layer 411 may be disposed on the second bottom conductive layer 409F and may have a same thickness as the third top conductive layer 511, but is not limited thereto. The second top conductive layer 411 may be formed of a same material as the third top conductive layer 511, but is not limited thereto. The second filler layer 413 may be disposed on the second top conductive layer 411.

Figure 8:
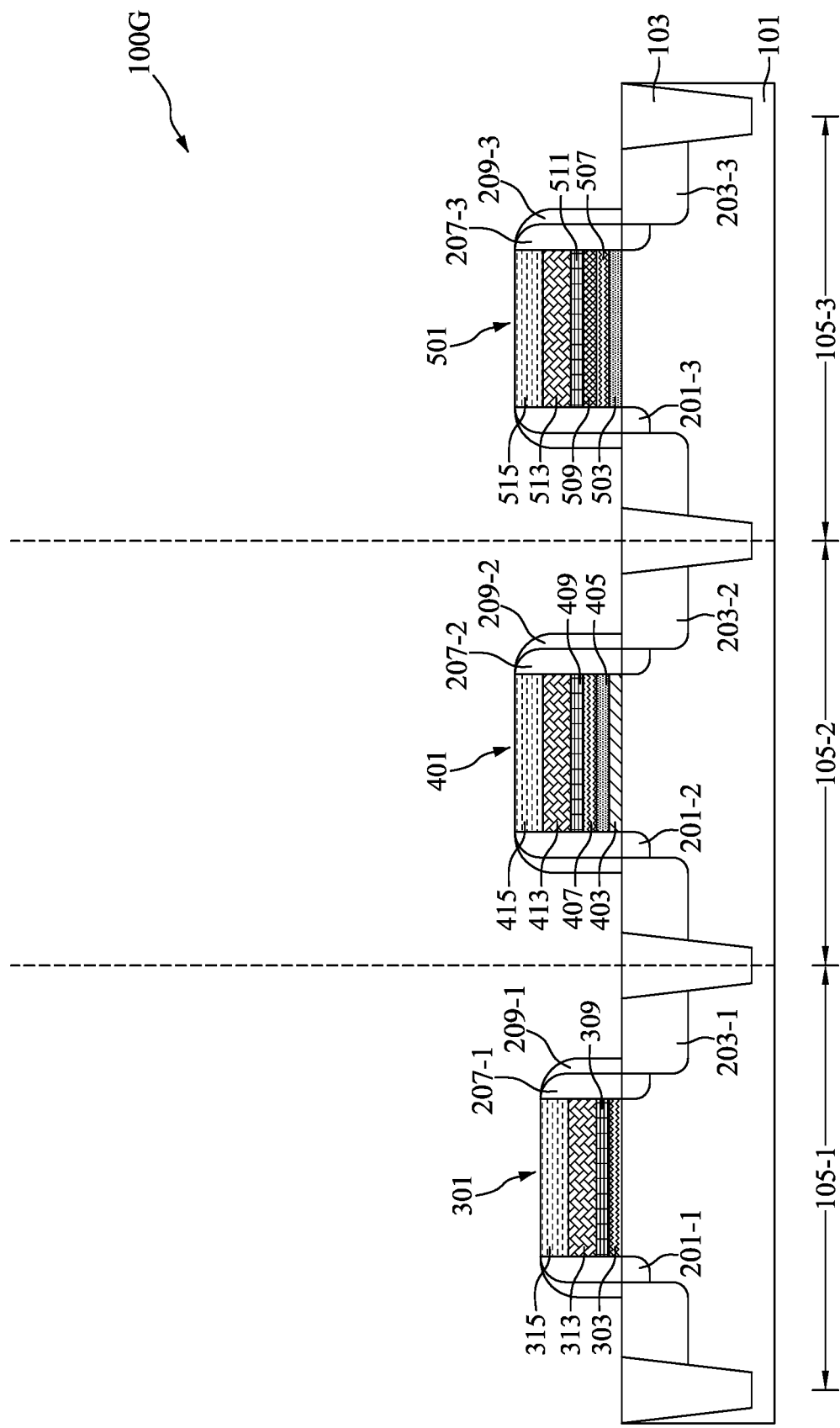

FIG. 8 illustrates, in a schematic cross-sectional view diagram, a semiconductor device 100G in accordance with another embodiment of the present disclosure.

With reference to FIG. 8, the semiconductor device 100G may include a first pair of outer spacers 209-1, a second pair of outer spacers 209-2, and a third pair of outer spacers 209-3. The first pair of outer spacers 209-1, the second pair of outer spacers 209-2, and the third pair of outer spacers 209-3 may be formed of, for example, silicon oxide, silicon nitride, or the like. The first pair of outer spacers 209-1, the second pair of outer spacers 209-2, and the third pair of outer spacers 209-3 may be formed of a same material, but are not limited thereto. The first pair of outer spacers 209-1 may be respectively correspondingly attached to outer surfaces of the first pair of inner spacers 207-1. The second pair of outer spacers 209-2 may be respectively correspondingly attached to outer surfaces of the second pair of inner spacers 207-2. The third pair of outer spacers 209-3 may be respectively correspondingly attached to outer surfaces of the third pair of inner spacers 207-3.

Due to the presence of the first pair of outer spacers 209-1, the second pair of outer spacers 209-2, and the third pair of outer spacers 209-3, thicknesses of the first pair of inner spacers 207-1, the second pair of inner spacers 207-2, and the third pair of inner spacers 207-3 may be minimized, thereby reducing overlap capacitance occurring between the plurality of doped regions and the first semiconductor stack 301, the second semiconductor stack 401, and the third semiconductor stack 501. As a result, performance of the semiconductor device 100G may be improved.

Figure 9:
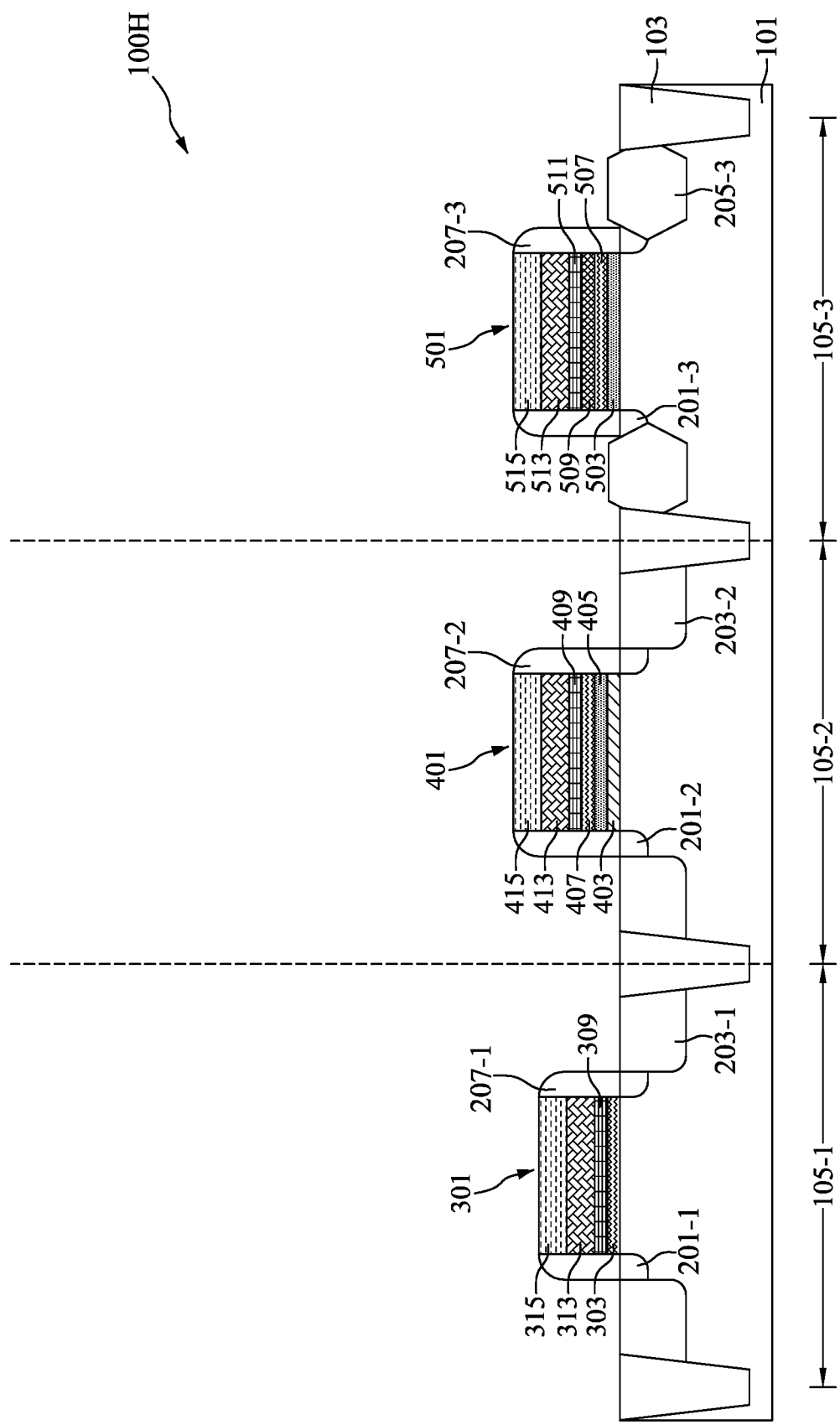

FIG. 9 illustrates, in a schematic cross-sectional view diagram, a semiconductor device 100H in accordance with another embodiment of the present disclosure.

With reference to FIG. 9, the semiconductor device 100H may include a third pair of stress regions 205-3. The third pair of stress regions 205-3 may be disposed at the third active region 105-3. Specifically, lower portions of the third pair of stress regions 205-3 may be disposed in the substrate 101 and may be respectively correspondingly adjacent to the two third lightly-doped regions 201-3. Upper portions of the third pair of stress regions 205-3 may protrude from a top surface of the substrate 101 and may be respectively correspondingly disposed adjacent to the third pair of inner spacers 207-3. The third pair of stress regions 205-3 may be formed of a material having a second lattice constant which may be different from the first lattice constant of the substrate 101. Specifically, the third pair of stress regions 205-3 may be formed of, for example, silicon germanium. Due to the lattice mismatch between the substrate 101 and the third pair of stress regions 205-3, the carrier mobility may be increased; therefore, the performance of the semiconductor device 100H may be improved.

Figure 10:
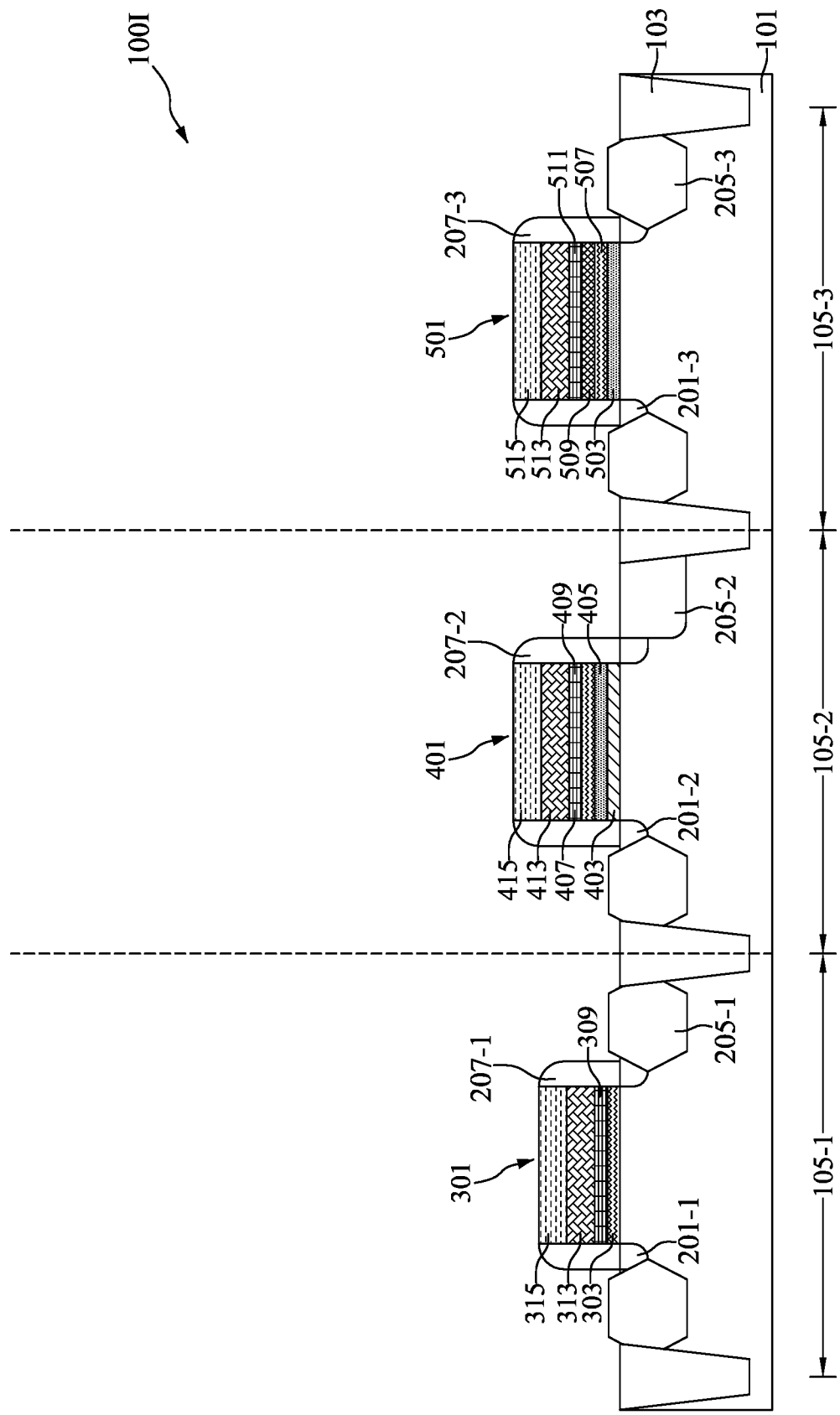

FIG. 10 illustrates, in a schematic cross-sectional view diagram, a semiconductor device 100I in accordance with another embodiment of the present disclosure.

With reference to FIG. 10 and in comparison to FIG. 9, the semiconductor device 100I may include a first pair of stress regions 205-1 and a second pair of stress regions 205-2. The first pair of stress regions 205-1 and the second pair of stress regions 205-2 may be respectively correspondingly disposed at the first active region 105-1 and the second active region 105-2 in a manner similar to that of the third pair of stress regions 205-3 illustrated in FIG. 9. The first pair of stress regions 205-1 and the second pair of stress regions 205-2 may be formed of a material having a third lattice constant which may be different from the first lattice constant of the substrate 101. Specifically, the first pair of stress regions 205-1 and the second pair of stress regions 205-2 may be formed of, for example, silicon carbide.

Figure 11:
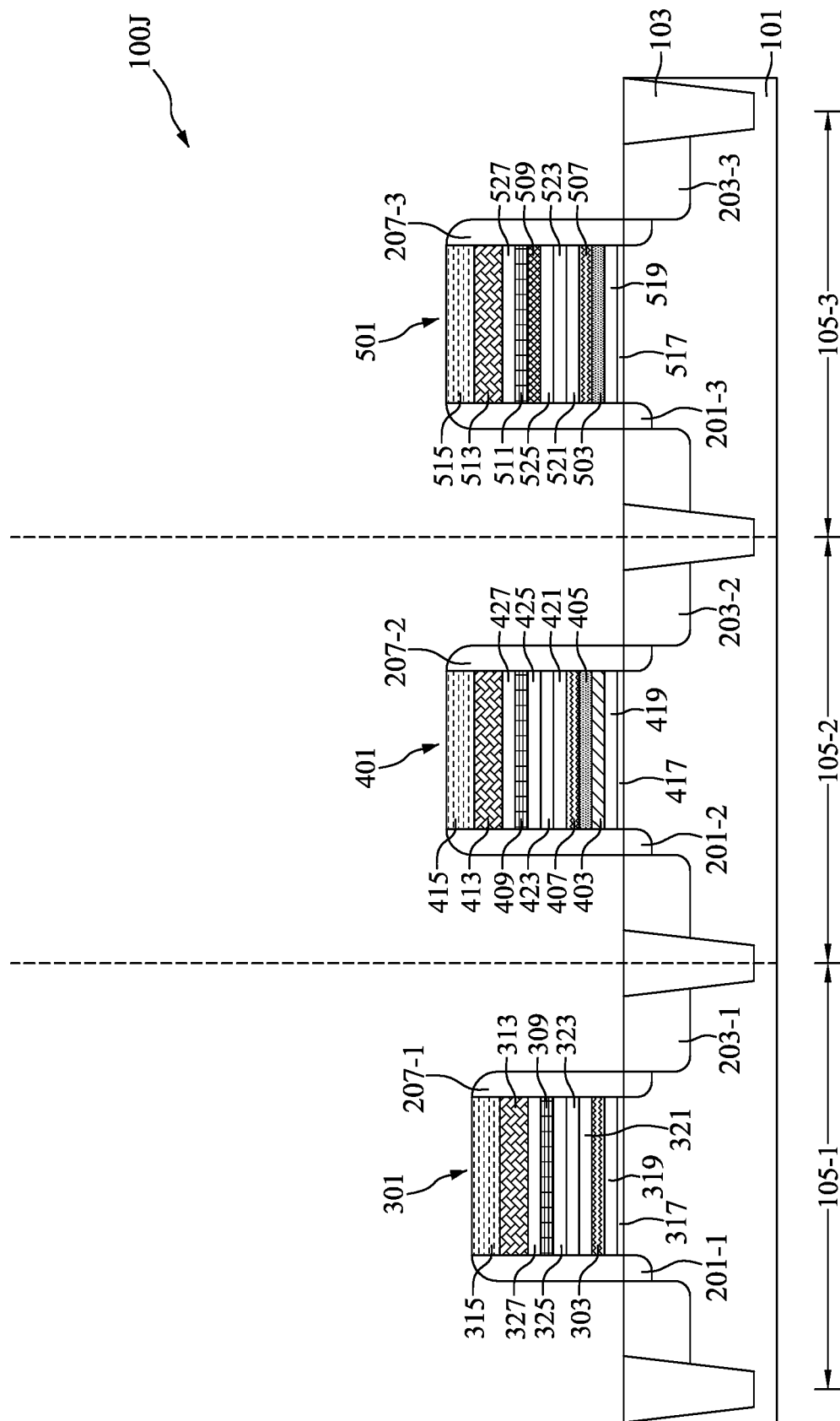

FIG. 11 illustrates, in a schematic cross-sectional view diagram, a semiconductor device 100J in accordance with another embodiment of the present disclosure.

With reference to FIG. 11, the first semiconductor stack 301 may include a first interfacial layer 317, a first dipole layer 319, a first functional layer 321, a first adjustment layer 323, a first protection layer 325, and a first encapsulation layer 327. The first interfacial layer 317 may be disposed between the substrate 101 and the first bottom insulating layer 303. The first interfacial layer 317 may facilitate formation of the first bottom insulating layer 303. The first interfacial layer 317 may have a thickness between about 5 angstroms and about angstroms. The first interfacial layer 317 may be formed of a chemical oxide of the underlying substrate 101 such as silicon oxide.

With reference to FIG. 11, the first dipole layer 319 may be disposed between the first bottom insulating layer 303 and the first interfacial layer 317. The first dipole layer 319 may have a thickness less than 2 nm. The first dipole layer 319 may displace defects in the first bottom insulating layer 303 and may improve the mobility and reliability of the first semiconductor stack 301. The first dipole layer 319 may be formed of a material including one or more of lutetium oxide, lutetium silicon oxide, yttrium oxide, yttrium silicon oxide, lanthanum oxide, lanthanum silicon oxide, barium oxide, barium silicon oxide, strontium oxide, strontium silicon oxide, aluminum oxide, aluminum silicon oxide, titanium oxide, titanium silicon oxide, hafnium oxide, hafnium silicon oxide, zirconium oxide, zirconium silicon oxide, tantalum oxide, tantalum silicon oxide, scandium oxide, scandium silicon oxide, magnesium oxide, and magnesium silicon oxide.

With reference to FIG. 11, the first functional layer 321 may be disposed on the first bottom insulating layer 303. The first functional layer 321 may have a thickness between about 10 angstroms and about angstroms and may be formed of, for example, titanium nitride or tantalum nitride. The first functional layer 321 may protect the first bottom insulating layer 303 from damage during subsequent semiconductor processes. The first adjustment layer 323 may be disposed on the first functional layer 321 and may include a material or an alloy including lanthanide nitride. The first adjustment layer 323 may be used to fine-tune the first threshold voltage. The first protection layer 325 may be disposed on the first adjustment layer 323 and may protect the first adjustment layer 323 from damage during subsequent semiconductor processes. The first protection layer 325 may be formed of, for example, titanium nitride.

With reference to FIG. 11, the first encapsulation layer 327 may be disposed between the first bottom conductive layer 309 and the first filler layer 313. The first encapsulation layer 327 may have a thickness between about 15 angstroms and about 25 angstroms. The first encapsulation layer 327 may be formed of, for example, titanium nitride. The first encapsulation layer 327 may protect layers below the first encapsulation layer 327 from mechanical damage or diffusion of the first filler layer 313.

With reference to FIG. 11, the second semiconductor stack 401 may include a second interfacial layer 417, a second dipole layer 419, a second functional layer 421, a second adjustment layer 423, a second protection layer 425, and a second encapsulation layer 427. The third semiconductor stack 501 may include a third interfacial layer 517, a third dipole layer 519, a third functional layer 521, a third adjustment layer 523, a third protection layer 525, and a third encapsulation layer 527. The aforementioned layers of the second semiconductor stack 401 and the third semiconductor stack 501 may be disposed in a manner similar to that of the first semiconductor stack 301.

Figure 12:
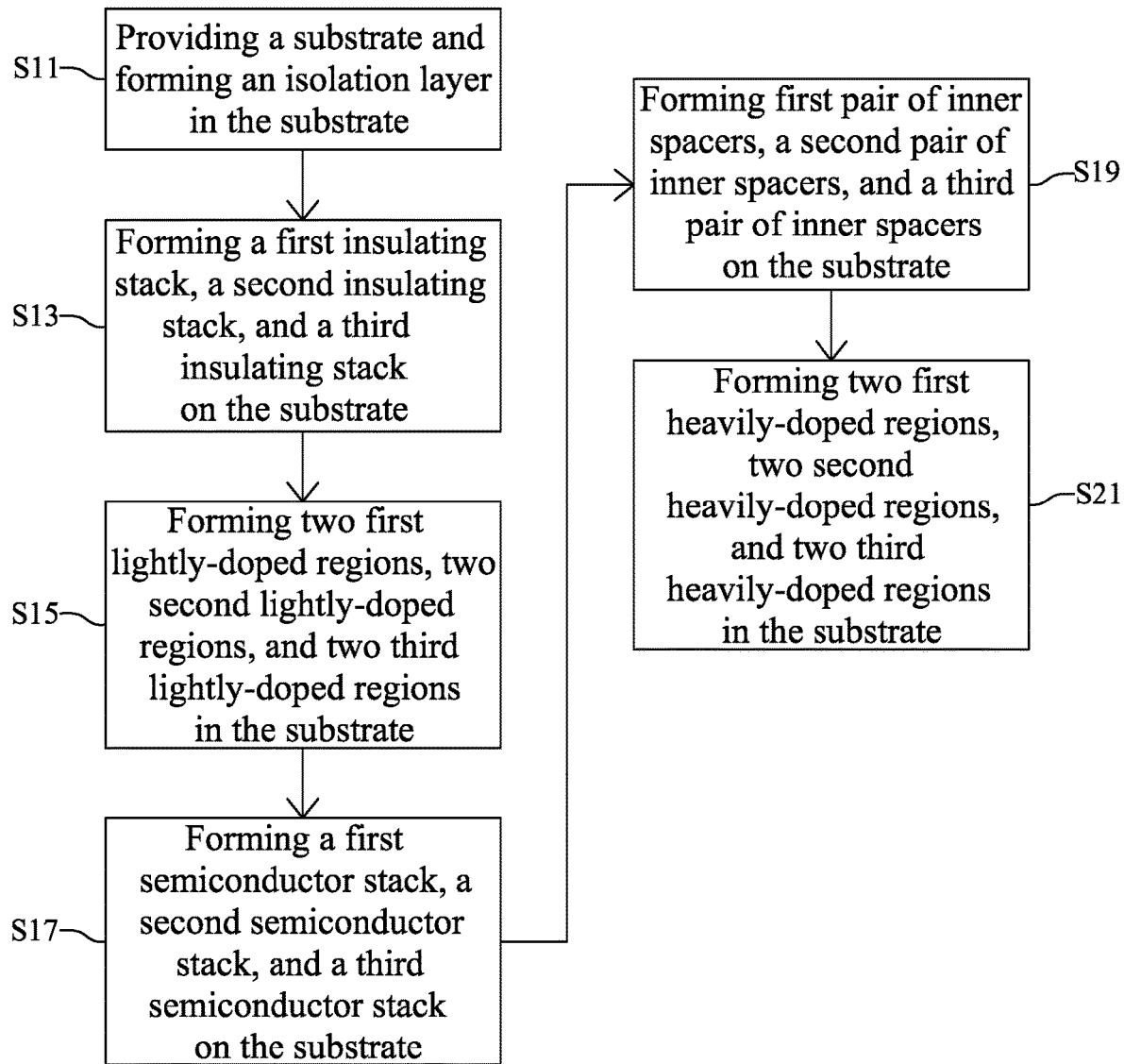
FIG. 12 illustrates, in a flowchart diagram form, a method for fabricating a semiconductor device in accordance with one embodiment of the present disclosure.

FIG. 12 illustrates, in a flowchart diagram form, a method 30 for fabricating a semiconductor device 100A in accordance with one embodiment of the present disclosure. FIGS. 13 to 36 illustrate, in schematic cross-sectional diagrams, a flow of fabricating the semiconductor device 100A in accordance with one embodiment of the present disclosure.

Figure 13:
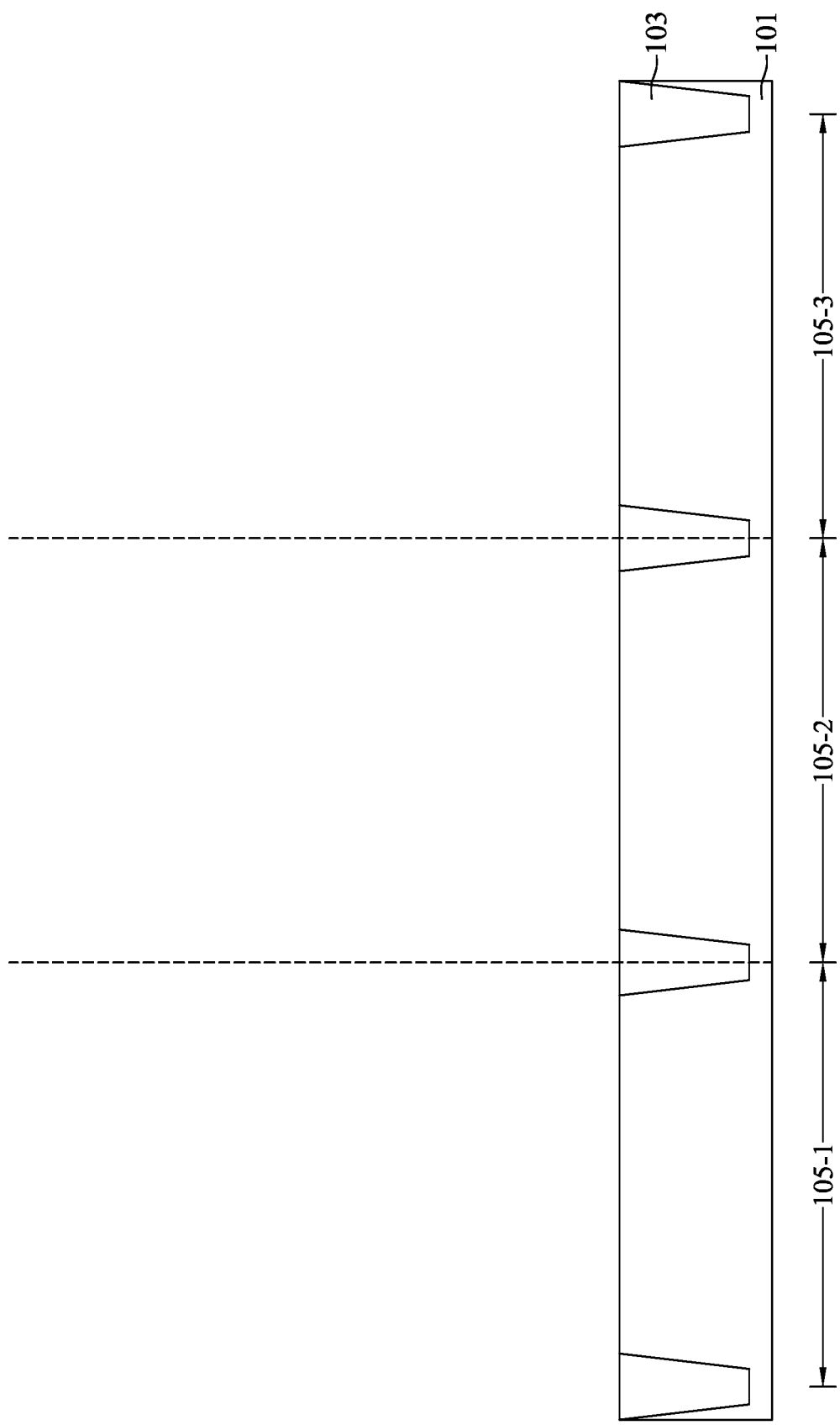
FIGS. 13 to 36 illustrate, in schematic cross-sectional diagrams, a flow of fabricating the semiconductor device in accordance with one embodiment of the present disclosure.

With reference to FIGS. 12 and 13, at step S11, in the embodiment depicted, a substrate 101 may be provided and an isolation layer 103 may be formed in the substrate 101 and may define a first active region 105-1, a second active region 105-2, and a third active region 105-3.

With reference to FIGS. 12 and 14 to 19, at step S13, in the embodiment depicted, a first insulating stack, a second insulating stack, and a third insulating stack may be respectively correspondingly formed on the first active region 105-1, the second active region 105-2, and the third active region 105-3.

Figure 14:
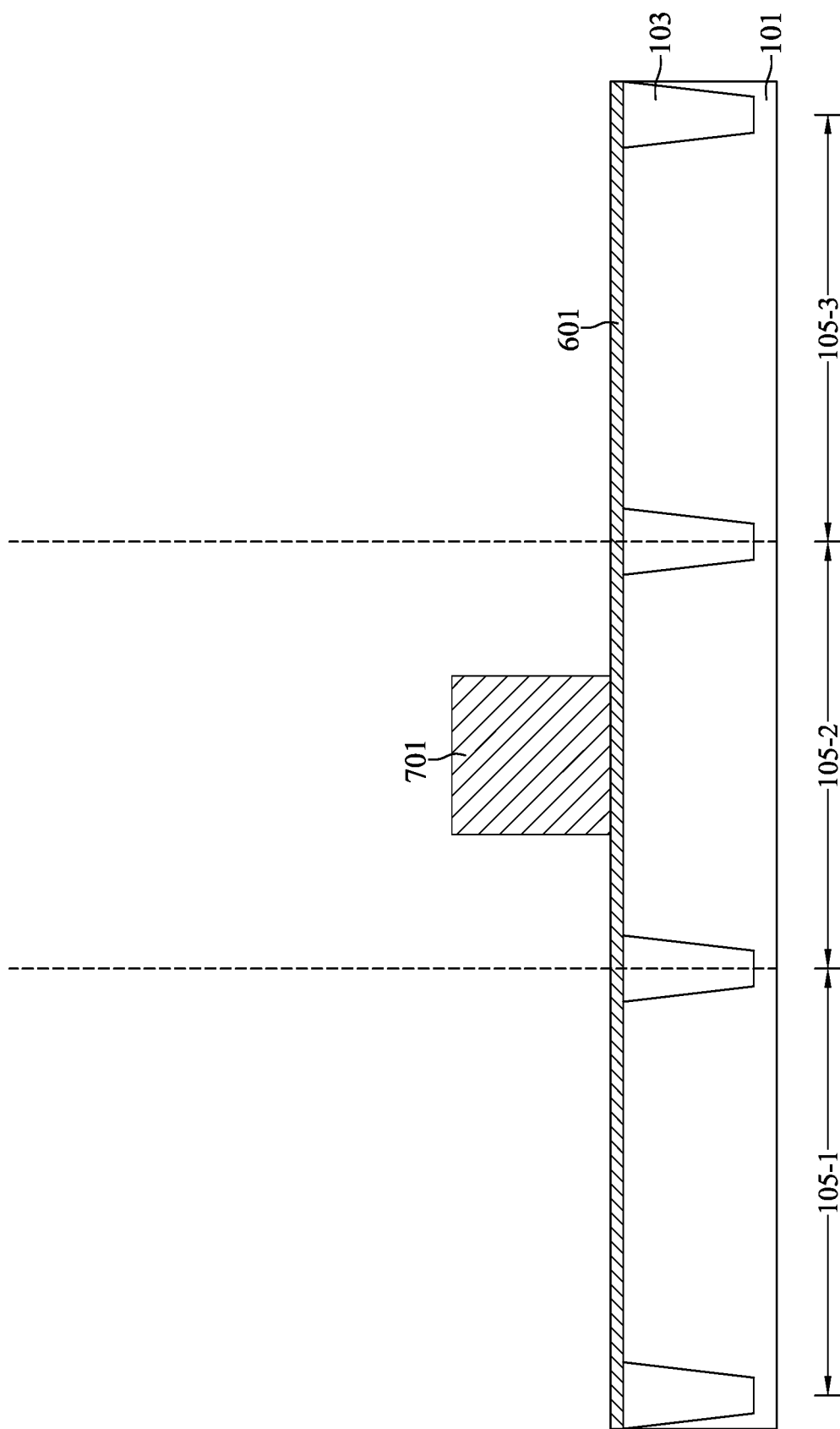
Figure 15:
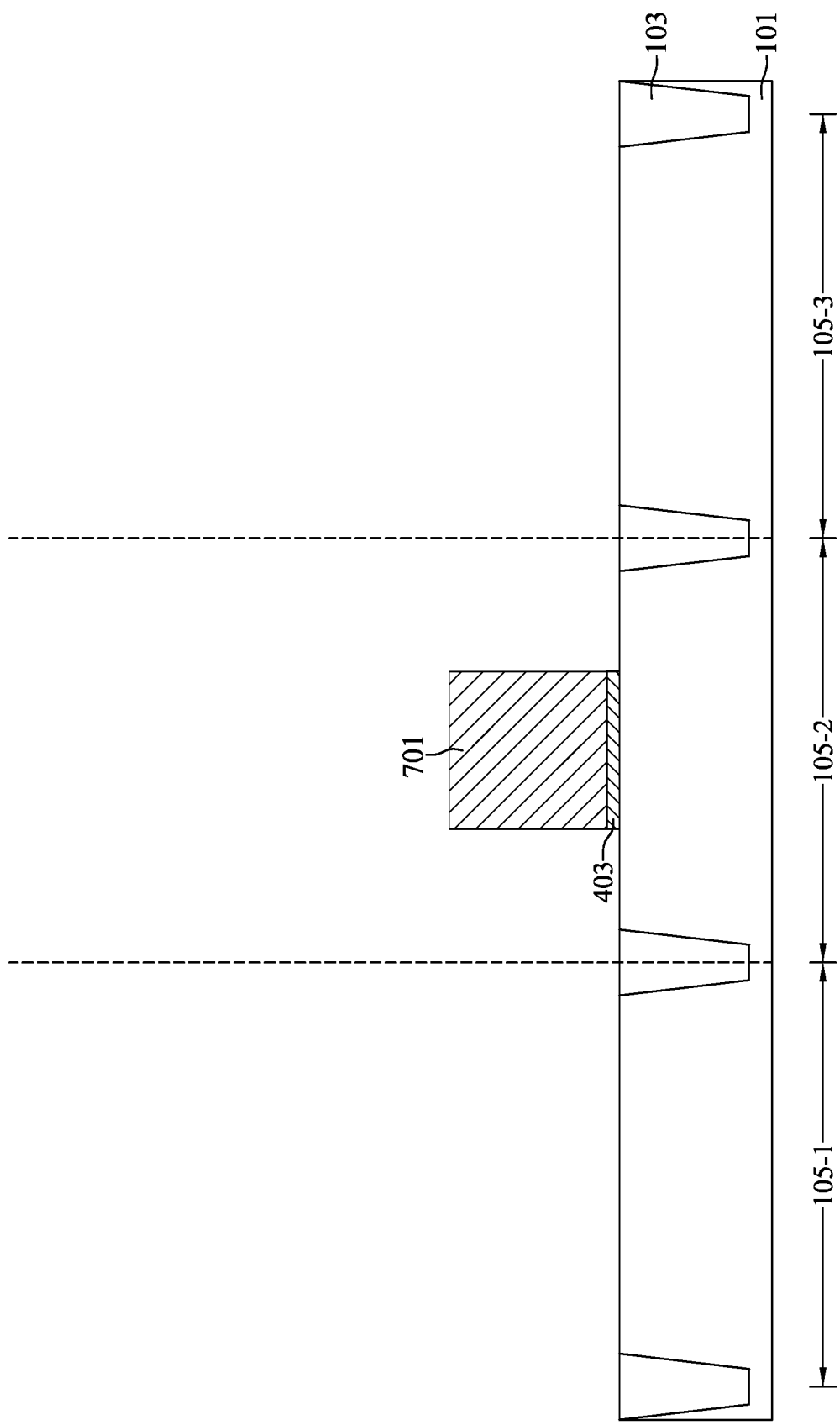

With reference to FIG. 14, a bottom insulating film 601 may be deposited on the substrate 101. The bottom insulating film 601 may have a thickness between about 0.1 nm and about 3.0 nm. The bottom insulating film 601 may be formed of, for example, silicon oxide, silicon nitride, silicon oxynitride, silicon nitride oxide, or the like. Alternatively, in another embodiment, the bottom insulating film 601 may be formed of an insulating material having a dielectric constant of about 4.0 or greater. A mask layer may be formed on the bottom insulating film 601. After development, the mask layer may be turned into a first mask segment 701 on the bottom insulating film 601 at the second active region 105-2. With reference to FIG. 15, an etch process, such as an anisotropic dry etch process, may be performed to remove portions of the bottom insulating film 601 and turn the bottom insulating film 601 into a second bottom insulating layer 403. After the etch process, the first mask segment 701 may be removed.

Figure 16:
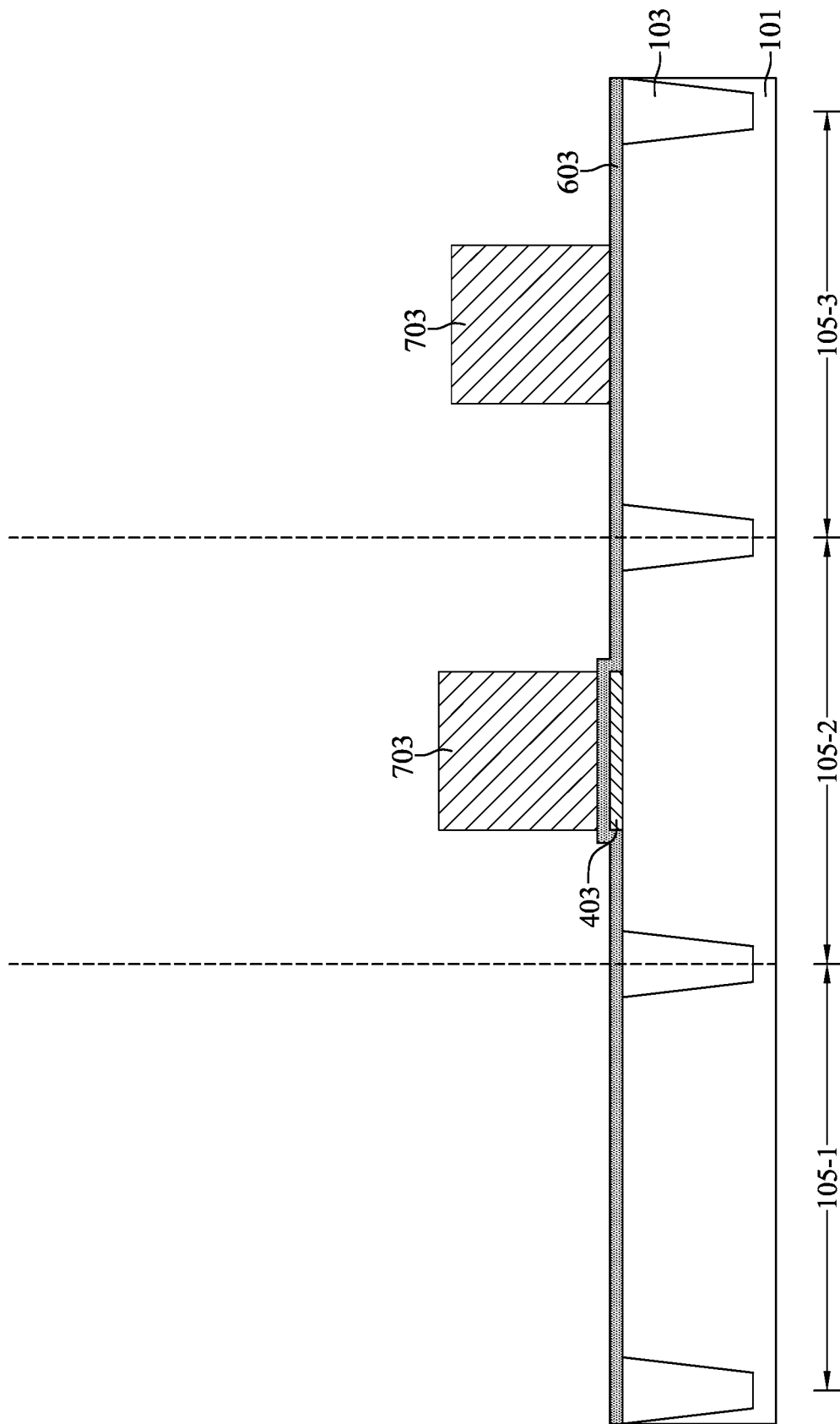
Figure 17:
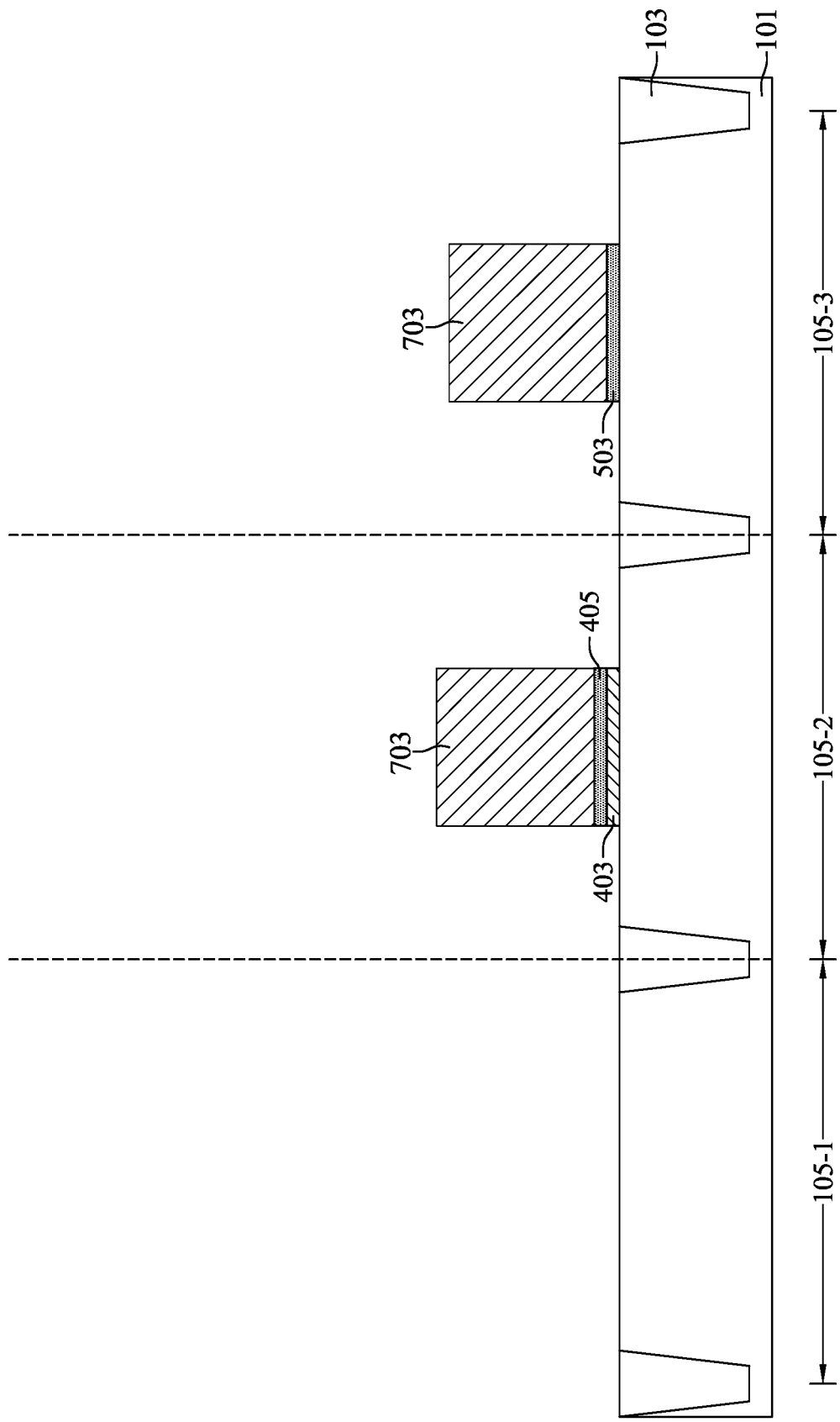

With reference to FIG. 16, a middle insulating film 603 may be deposited on the substrate 101 and on the second bottom insulating layer 403. The middle insulating film 603 may have a thickness between about 0.1 nm and about 2.0 nm. The middle insulating film 603 may be formed of a same material as the bottom insulating film 601, but is not limited thereto. A mask layer may be formed on the middle insulating film 603. After development, the mask layer may be turned into a plurality of second mask segments 703 on the middle insulating film 603 at the second active region 105-2 and the third active region 105-3. With reference to FIG. 17, an etch process, such as an anisotropic dry etch process, may be performed to remove portions of the middle insulating film 603 and turn the middle insulating film 603 into a second middle insulating layer 405 and a third bottom insulating layer 503. After the etch process, the plurality of second mask segments 703 may be removed.

Figure 18:
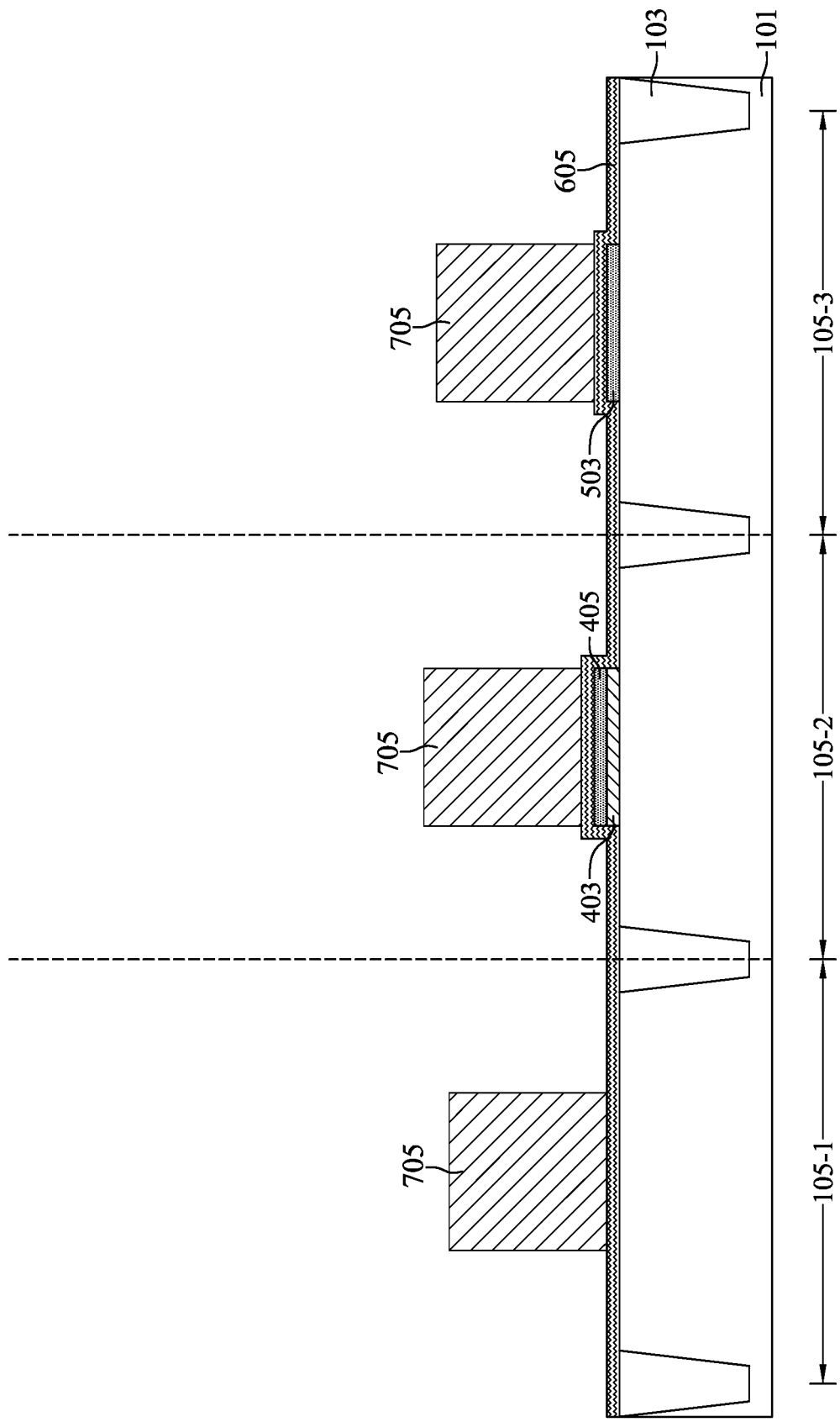
Figure 19:
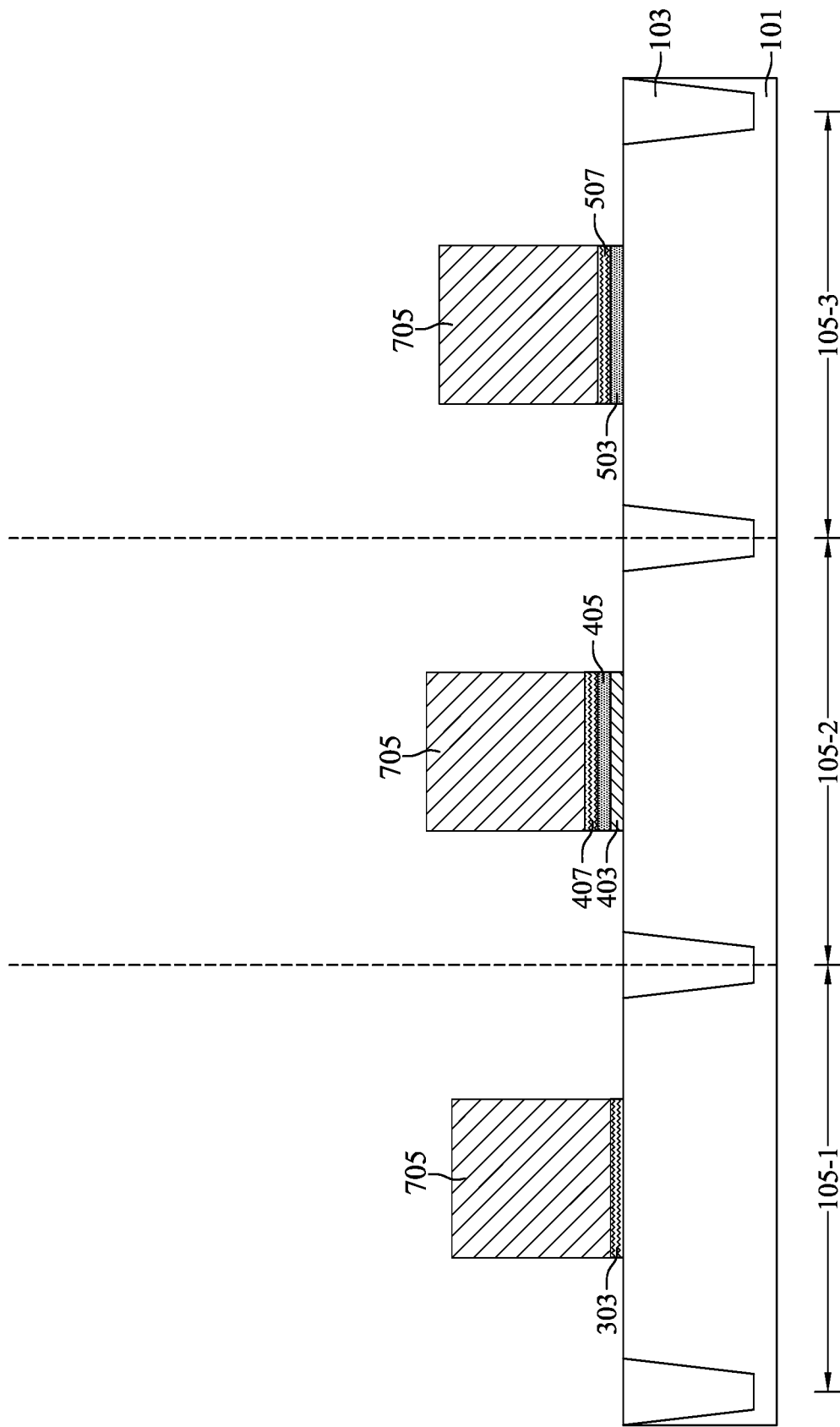

With reference to FIG. 18, a top insulating film 605 may be deposited on the substrate 101, the second middle insulating layer 405, and the third bottom insulating layer 503. The top insulating film 605 may have a thickness between about 0.5 nm and about 5.0 nm. The top insulating film 605 may be formed of a same material as the bottom insulating film 601, but is not limited thereto. A mask layer may be formed on the top insulating film 605. After development, the mask layer may be turned into a plurality of third mask segments 705 on the top insulating film 605 at the first active region 105-1, the second active region 105-2, and the third active region 105-3. With reference to FIG. 19, an etch process, such as an anisotropic dry etch process, may be performed to remove portions of the top insulating film 605 and turn the top insulating film 605 into a first bottom insulating layer 303, a second top insulating layer 407, and a third top insulating layer 507. After the etch process, the plurality of third mask segments 705 may be removed.

The first bottom insulating layer 303 alone may be regarded as the first insulating stack. The second bottom insulating layer 403, the second middle insulating layer 405, and the second top insulating layer 407 may be regarded as the second insulating stack. The third bottom insulating layer 503 and the third top insulating layer 507 may be regarded as the third insulating stack.

Figure 20:
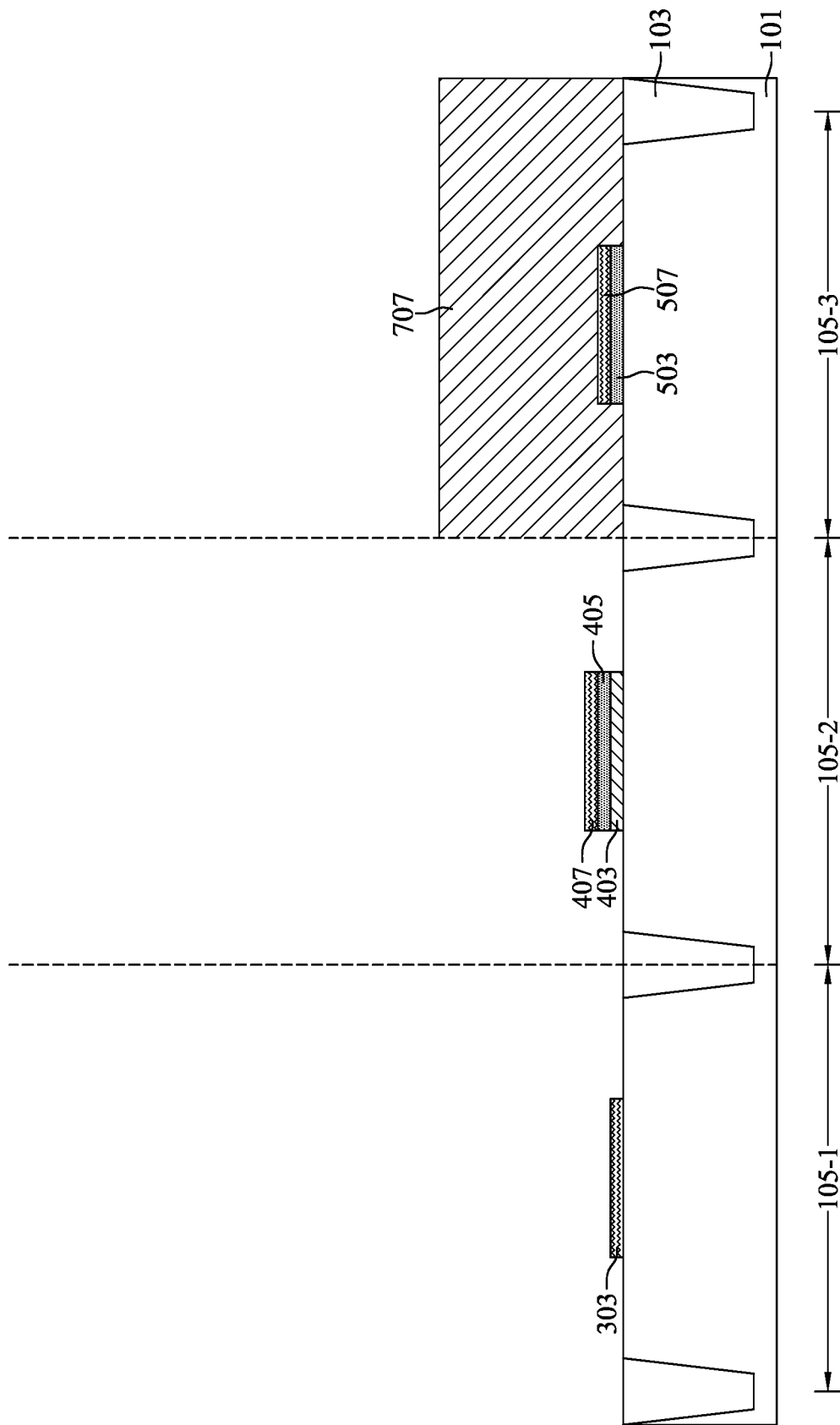
Figure 21:
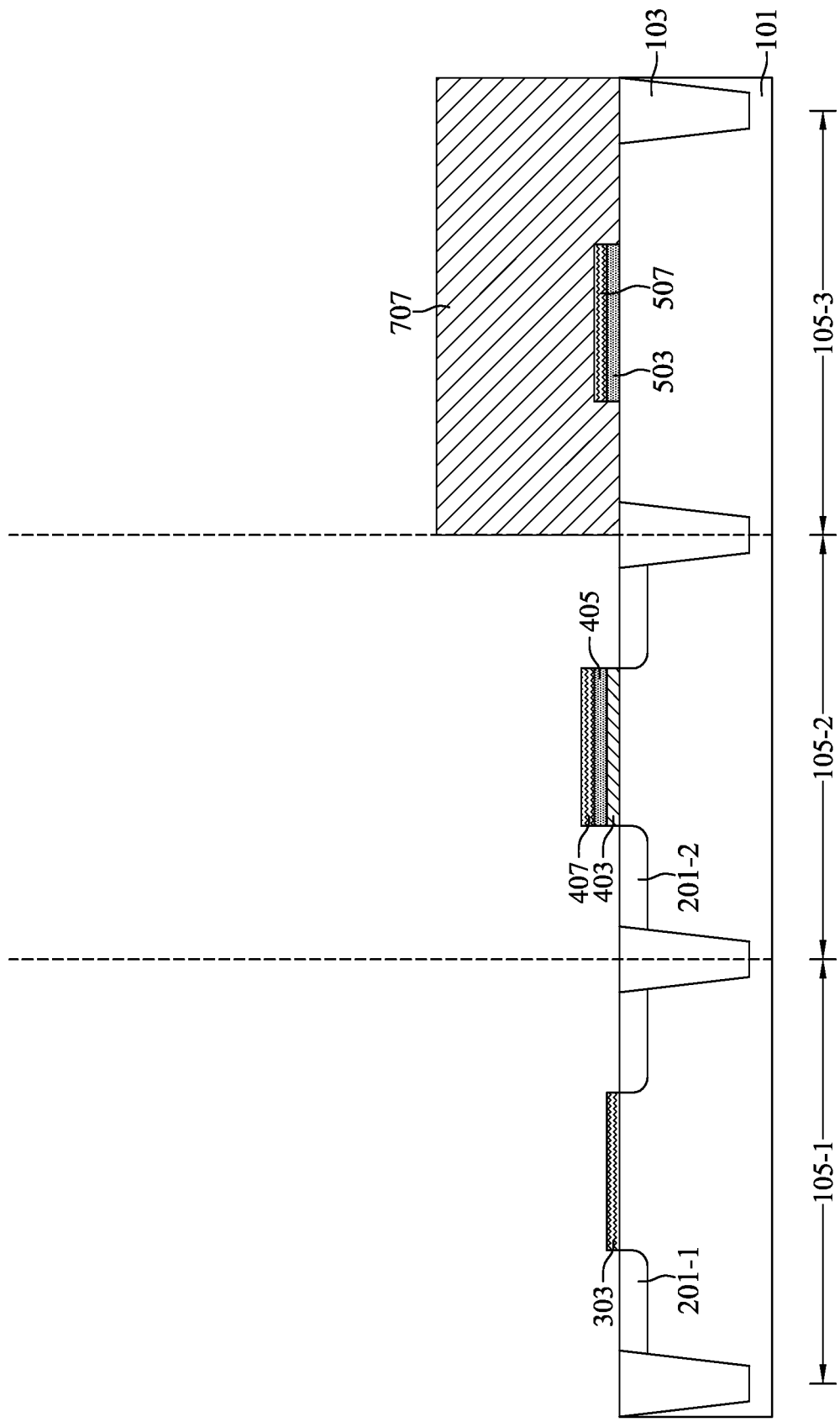
Figure 22:
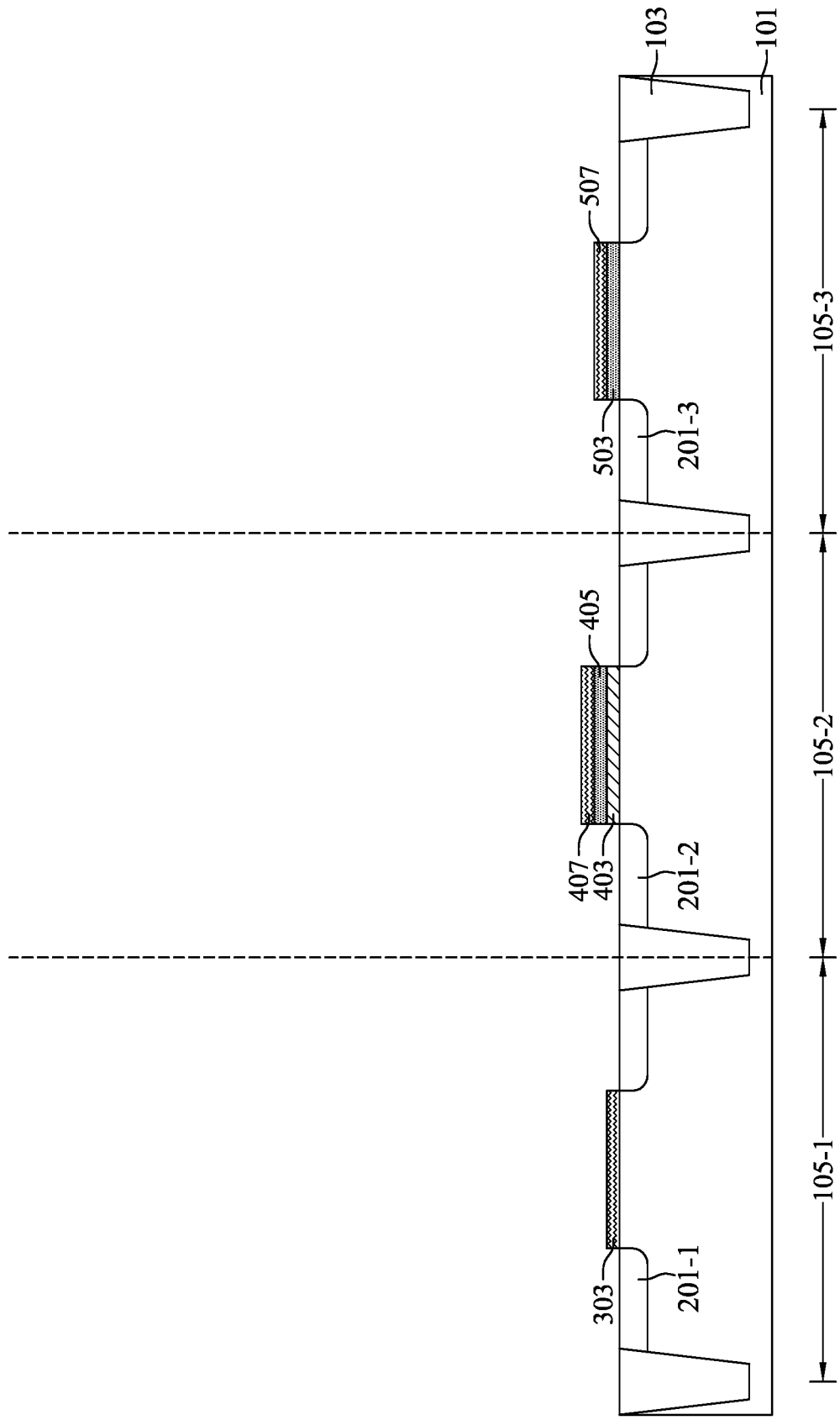

With reference to FIGS. 12 and 20 to 22, at step S15, in the embodiment depicted, two first lightly-doped regions 201-1, two second lightly-doped regions 201-2, and two third lightly-doped regions 201-3 may be respectively correspondingly formed in the first active region 105-1, the second active region 105-2, and the third active region 105-3. With reference to FIG. 20, a mask layer may be formed over the substrate 101. After development, the mask layer may be turned into a fourth mask segment 707 covering the third active region 105-3. With reference to FIG. 21, an implantation process using a dopant such as phosphorus, arsenic, or antimony may be performed to respectively correspondingly form the two first lightly-doped regions 201-1 and the two second lightly-doped regions 201-2 in the first active region 105-1 and the second active region 105-2. The fourth mask segment 707 may be removed after the implantation process. With reference to FIG. 22, the two third lightly-doped regions 201-3 may be formed in the third active region 105-3 with another implantation process similar to that of the two first lightly-doped regions 201-1 illustrated in FIGS. 20 and 21. The dopant used in the implantation process of the third active region 105-3 may be boron.

Figure 23:
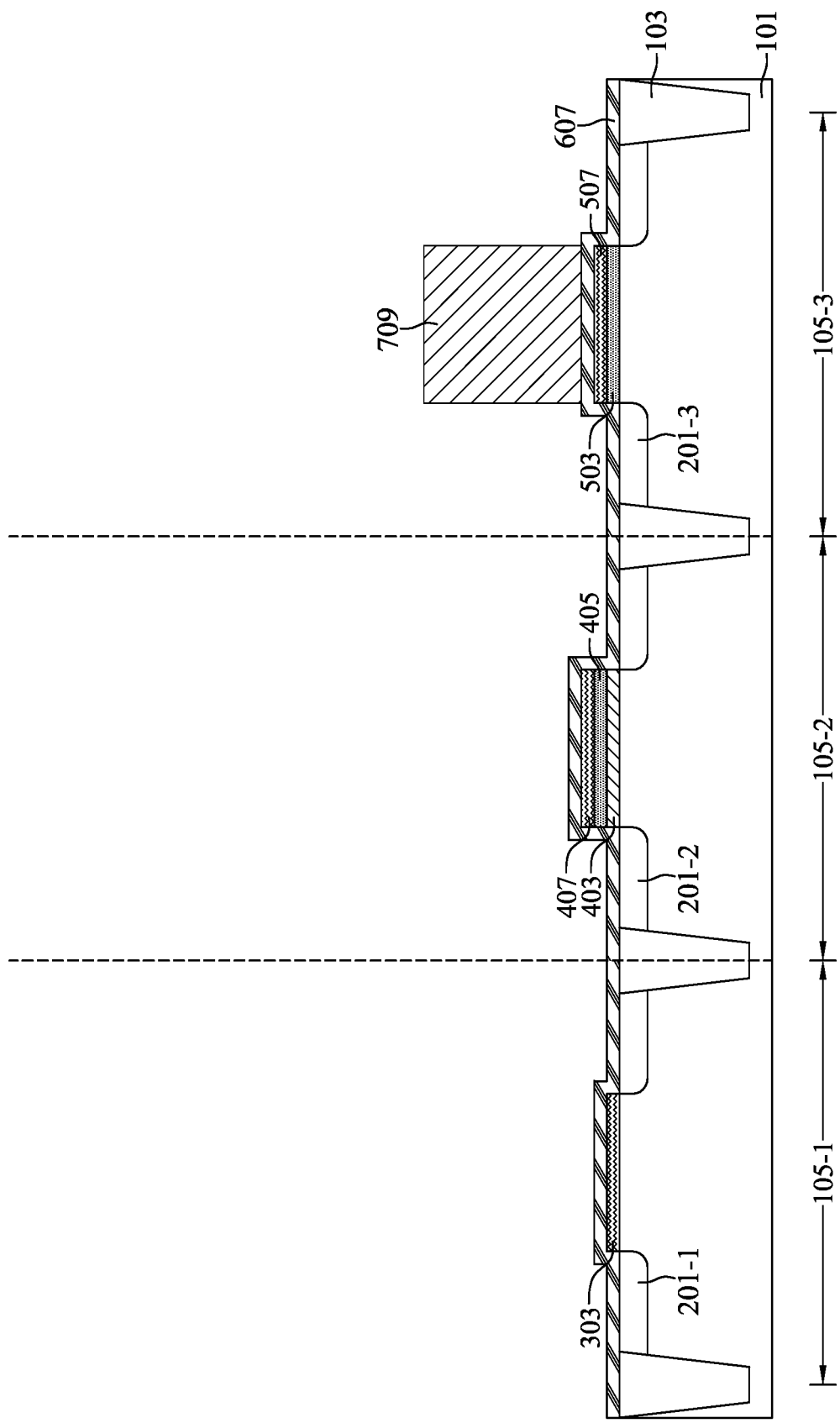
Figure 24:
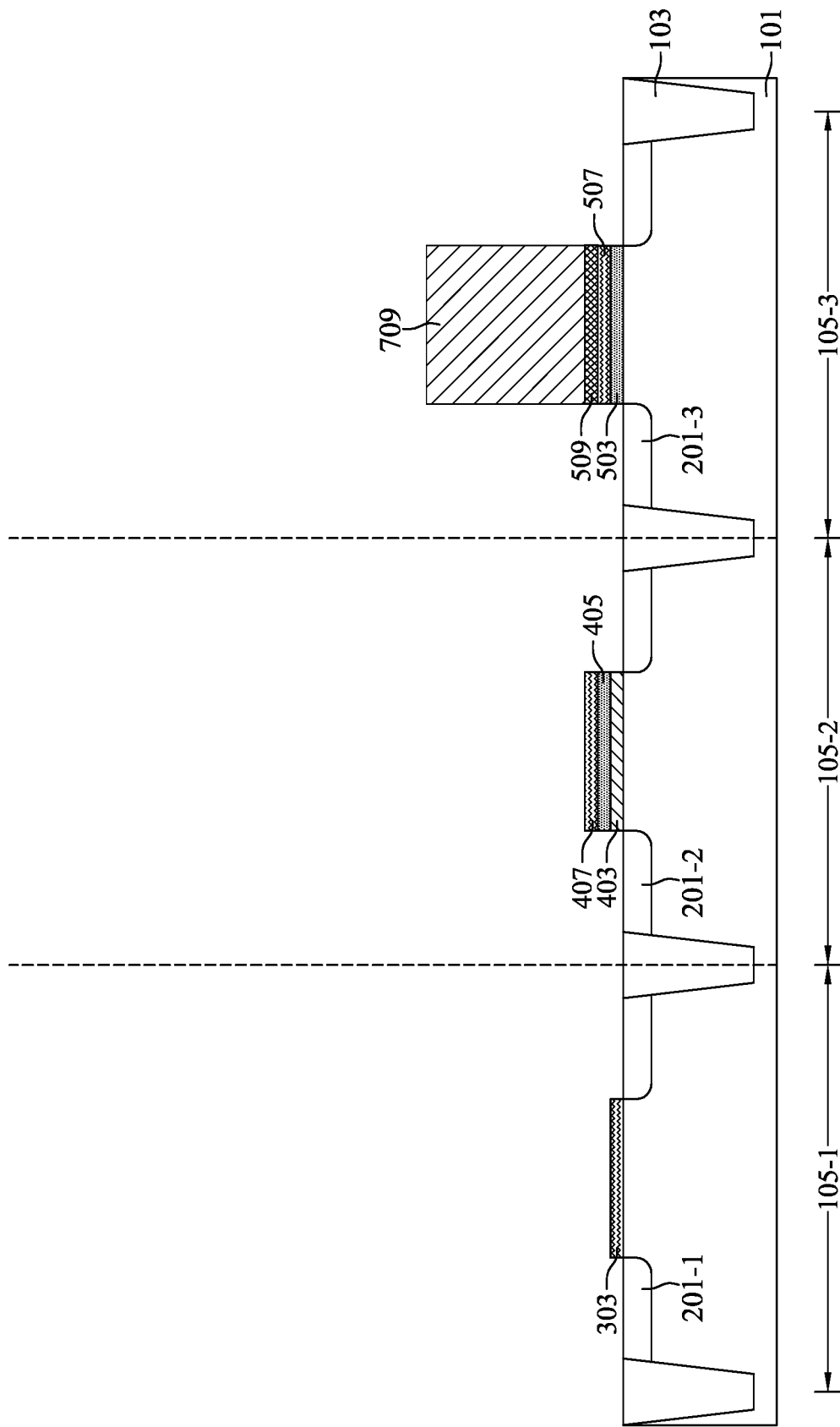

With reference to FIGS. 12 and 23 to 30, at step S17, in the embodiment depicted, a first semiconductor stack 301, a second semiconductor stack 401, and a third semiconductor stack 501 may be respectively correspondingly formed on the first active region 105-1, the second active region 105-2, and the third active region 105-3. With reference to FIG. 23, a bottom conductive film 607 may be deposited to cover the substrate 101, the first insulating stack, the second insulating stack, and the third insulating stack. The bottom conductive film 607 may have a thickness between about 10 angstroms and about 100 angstroms. The bottom conductive film 607 may be formed of, for example, titanium nitride, tantalum nitride, tantalum carbide, tungsten nitride, or ruthenium. A mask layer may be formed on the bottom conductive film 607. After development, the mask layer may be turned into a fifth mask segment 709 on the bottom conductive film 607 at the third active region 105-3. With reference to FIG. 24, an etch process, such as an anisotropic dry etch process, may be performed to remove portions of the bottom conductive film 607 and turn the bottom conductive film 607 into a third bottom conductive layer 509. After the etch process, the fifth mask segment 709 may be removed.

Figure 25:
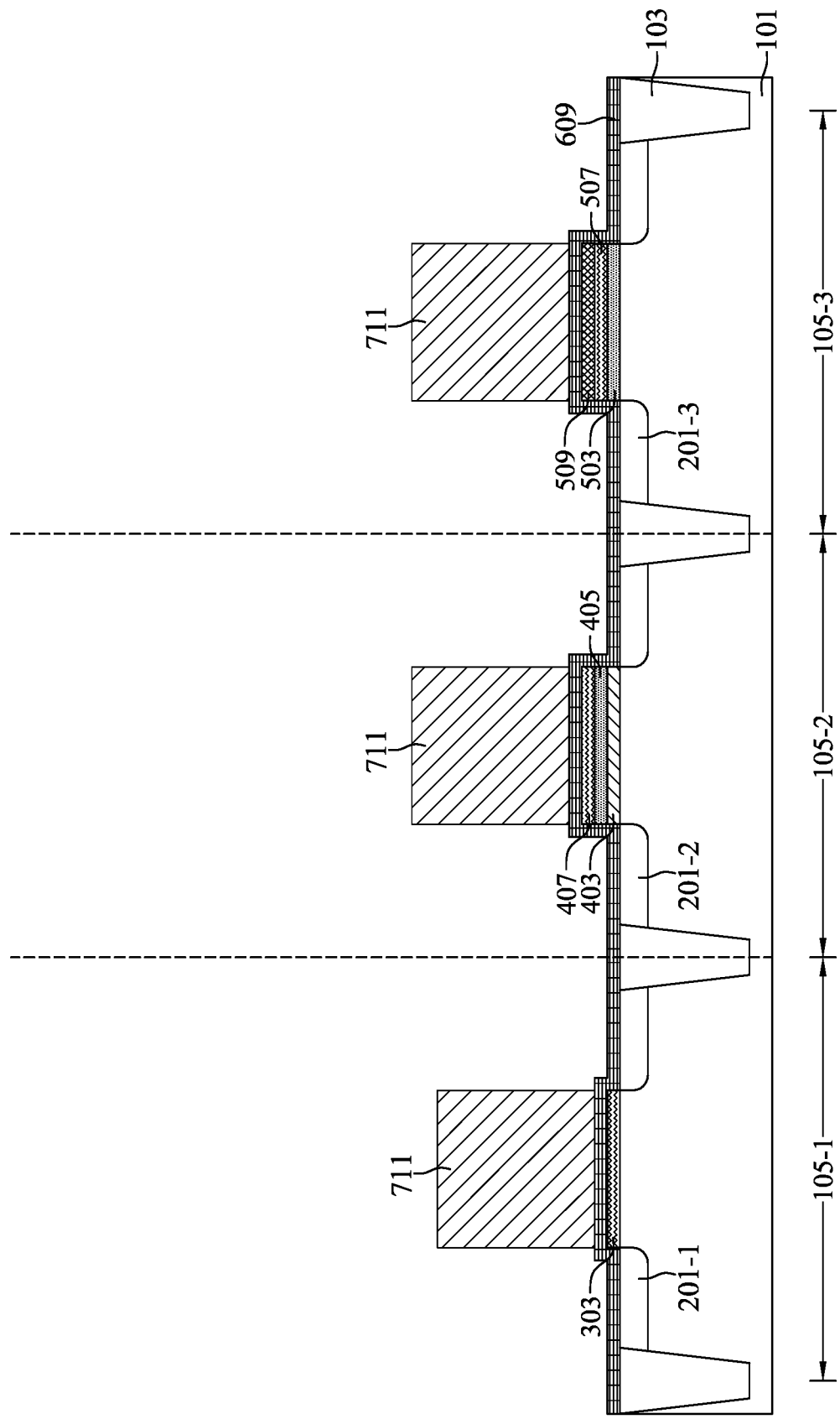
Figure 26:
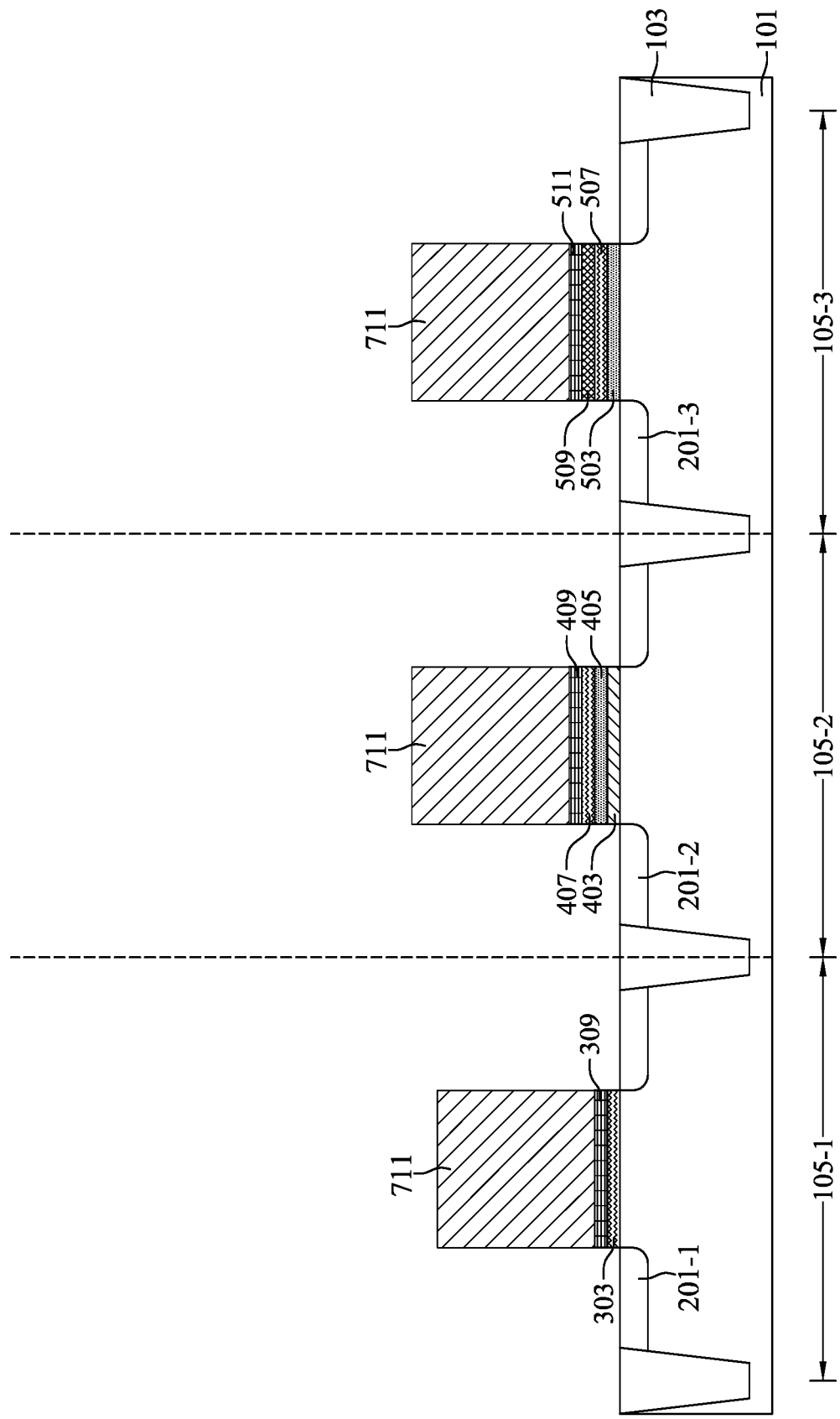

With reference to FIG. 25, a top conductive film 609 may be deposited to cover the substrate 101, the first insulating stack, the second insulating stack, and the third bottom conductive layer 509. The top conductive film 609 may have a thickness between about 10 angstroms and about 200 angstroms. The top conductive film 609 may be formed of, for example, aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride. A mask layer may be formed on the top conductive film 609. After development, the mask layer may be turned into a plurality of sixth mask segments 711 on the top conductive film 609 at the first active region 105-1, the second active region 105-2, and the third active region 105-3. With reference to FIG. 26, an etch process, such as an anisotropic dry etch process, may be performed to remove portions of the top conductive film 609 and turn the top conductive film 609 into a first bottom conductive layer 309, a second bottom conductive layer 409, and a third top conductive layer 511. After the etch process, the plurality of sixth mask segments 711 may be removed.

Figure 27:
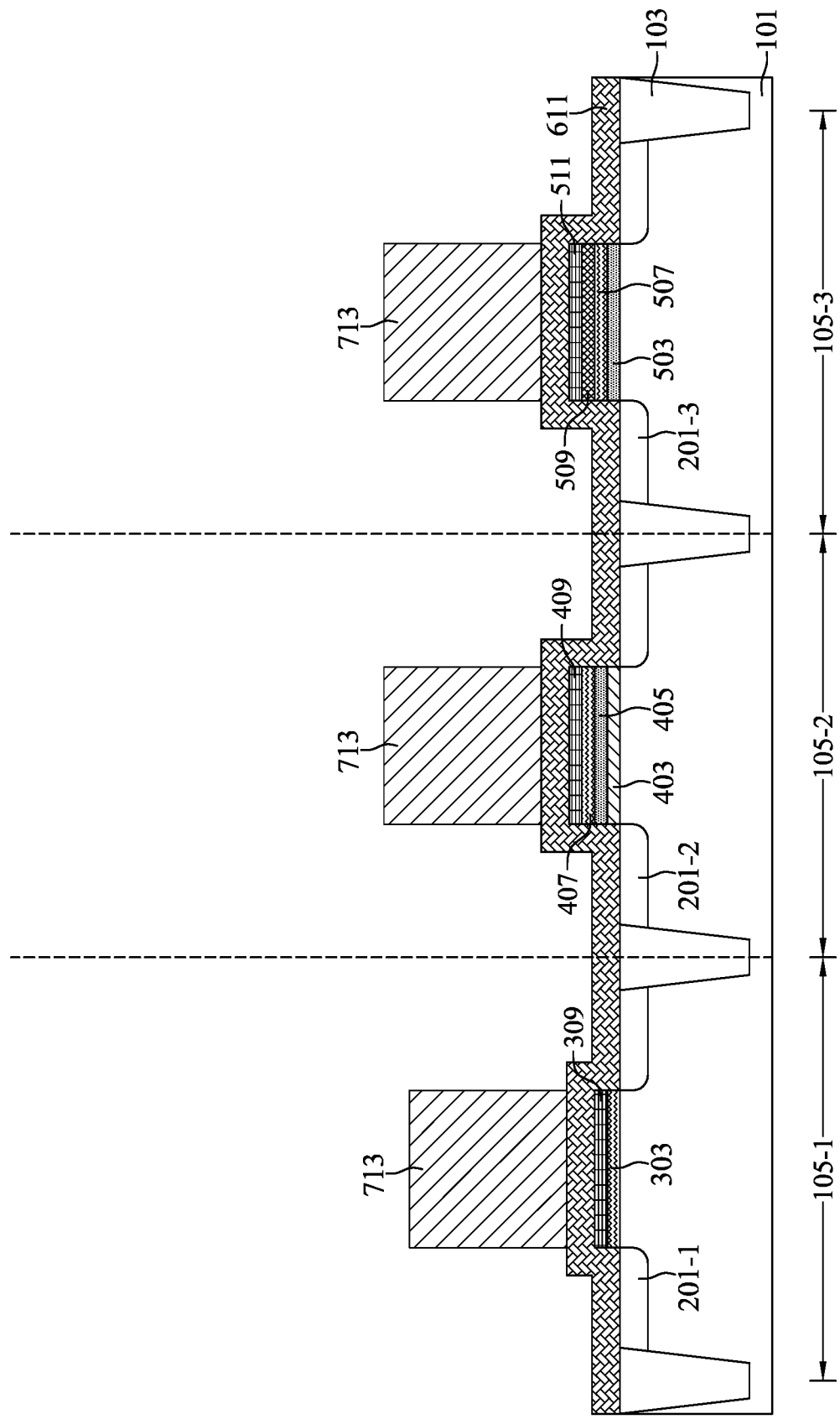
Figure 28:
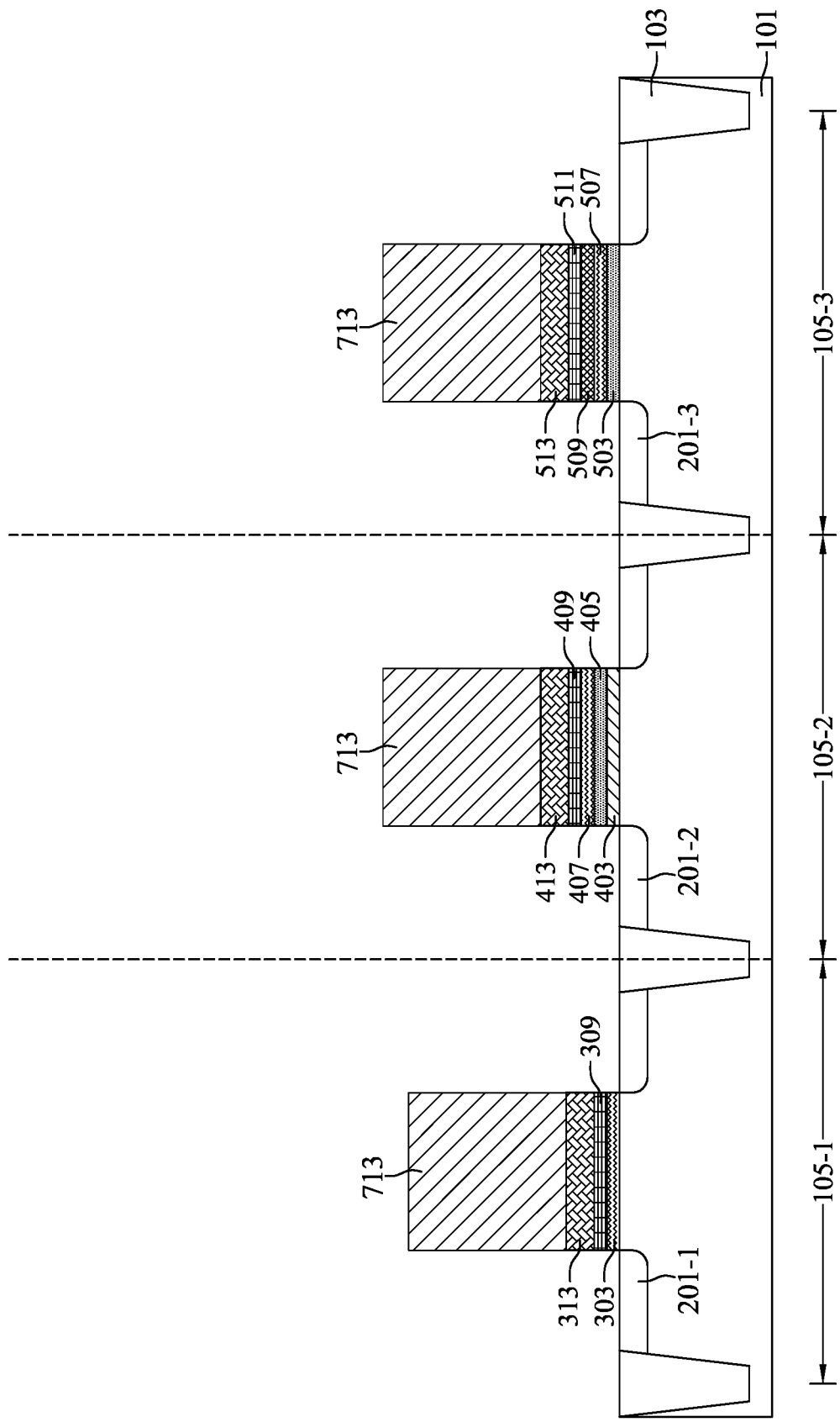

With reference to FIG. 27, a filler film 611 may be deposited to cover the substrate 101, the first bottom conductive layer 309, the second bottom conductive layer 409, and the third top conductive layer 511. The filler film 611 may be formed of, for example, tungsten or aluminum. A mask layer may be formed on the filler film 611. After development, the mask layer may be turned into a plurality of seventh mask segments 713 on the filler film 611 at the first active region 105-1, the second active region 105-2, and the third active region 105-3. With reference to FIG. 28, an etch process, such as an anisotropic dry etch process, may be performed to remove portions of the filler film 611 and turn the filler film 611 into a first filler layer 313, a second filler layer 413, and a third filler layer 513. After the etch process, the plurality of seventh mask segments 713 may be removed.

Figure 29:
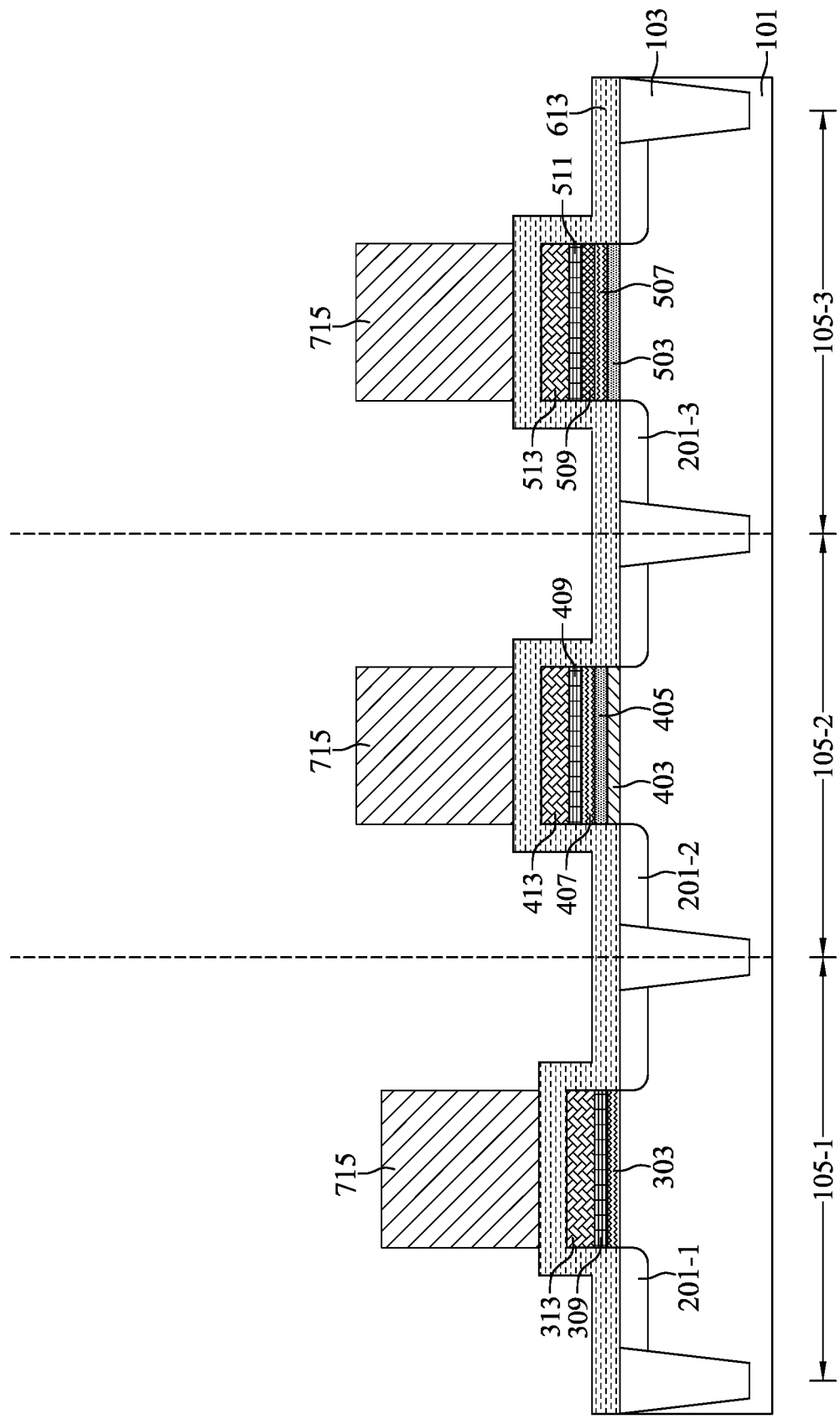
Figure 30:
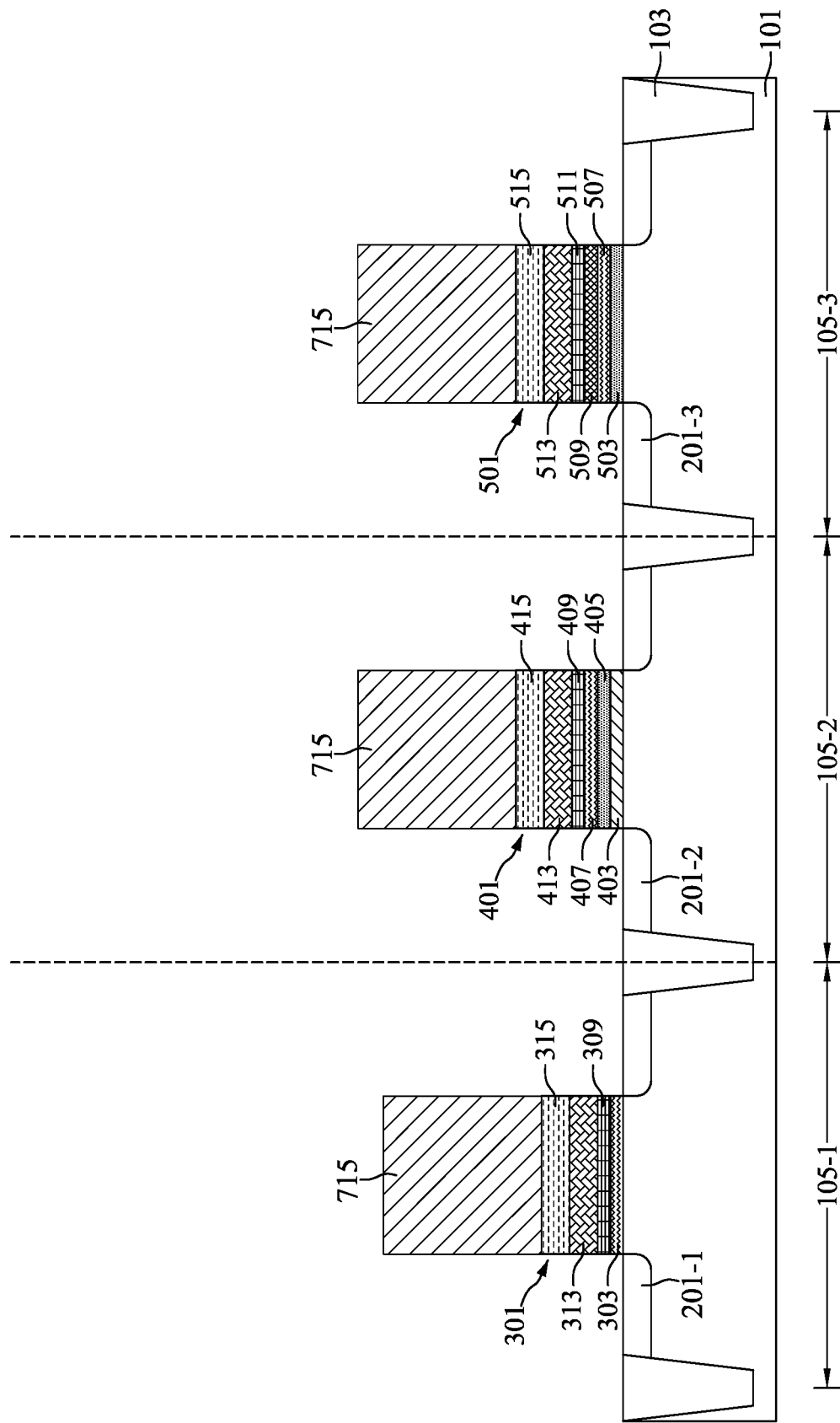

With reference to FIG. 29, a capping film 613 may be deposited to cover the substrate 101, the first filler layer 313, the second filler layer 413, and the third filler layer 513. The capping film 613 may be formed of, for example, silicon oxide, silicon nitride, silicon oxynitride, silicon nitride oxide, or fluoride-doped silicate. A mask layer may be formed on the capping film 613. After development, the mask layer may be turned into a plurality of eighth mask segments 715 on the capping film 613 at the first active region 105-1, the second active region 105-2, and the third active region 105-3. With reference to FIG. 30, an etch process, such as an anisotropic dry etch process, may be performed to remove portions of the capping film 613 and turn the capping film 613 into a first capping layer 315, a second capping layer 415, and a third capping layer 515. After the etch process, the plurality of eighth mask segments 715 may be removed.

The first bottom insulating layer 303, the first bottom conductive layer 309, the first filler layer 313, and the first capping layer 315 together form the first semiconductor stack 301. The second bottom insulating layer 403, the second middle insulating layer 405, the second top insulating layer 407, the second bottom conductive layer 409, the second filler layer 413, and the second capping layer 415 together form the second semiconductor stack 401. The third bottom insulating layer 503, the third top insulating layer 507, the third bottom conductive layer 509, the third top conductive layer 511, the third filler layer 513, and the third capping layer 515 together form the third semiconductor stack 501.

Figure 31:
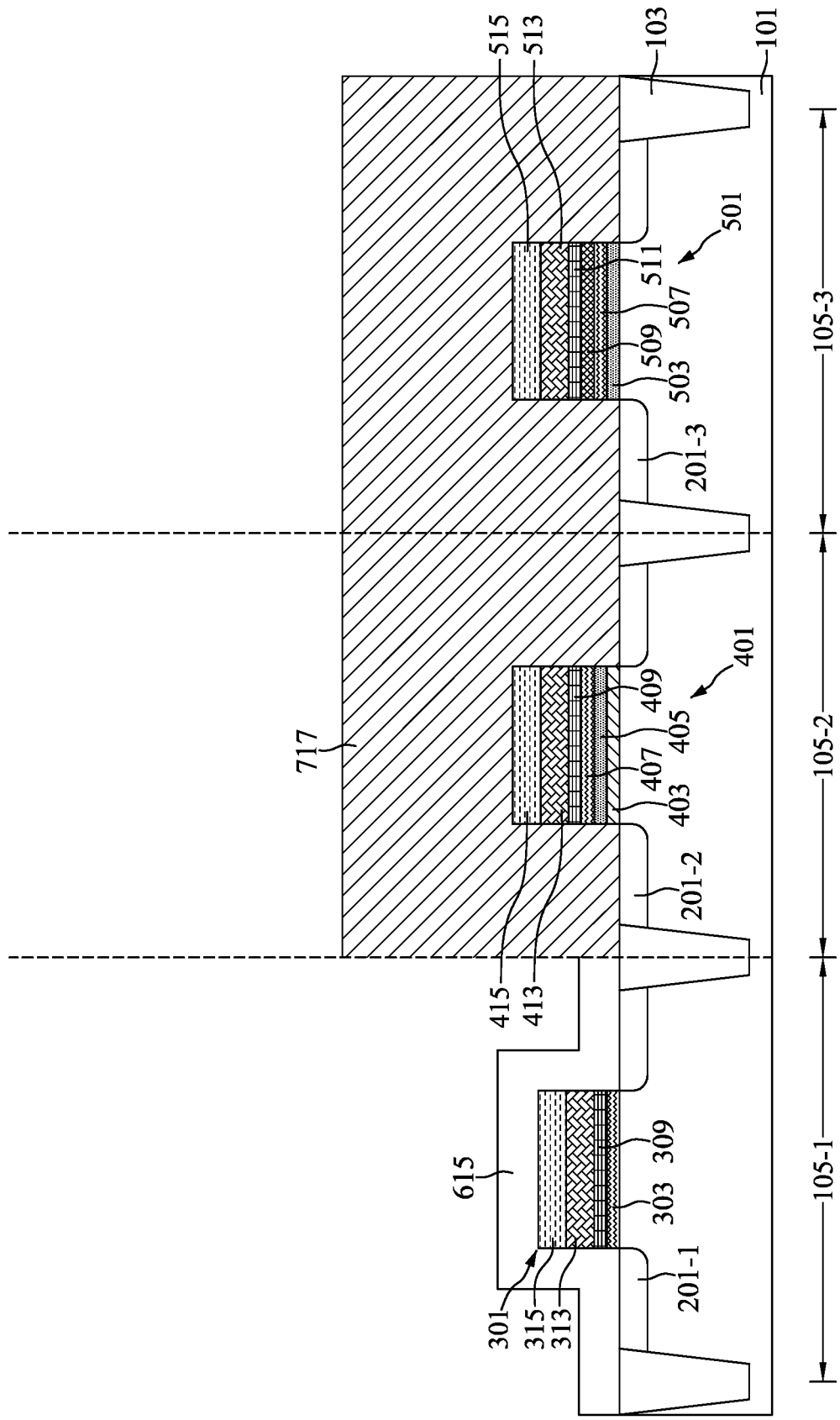
Figure 32:
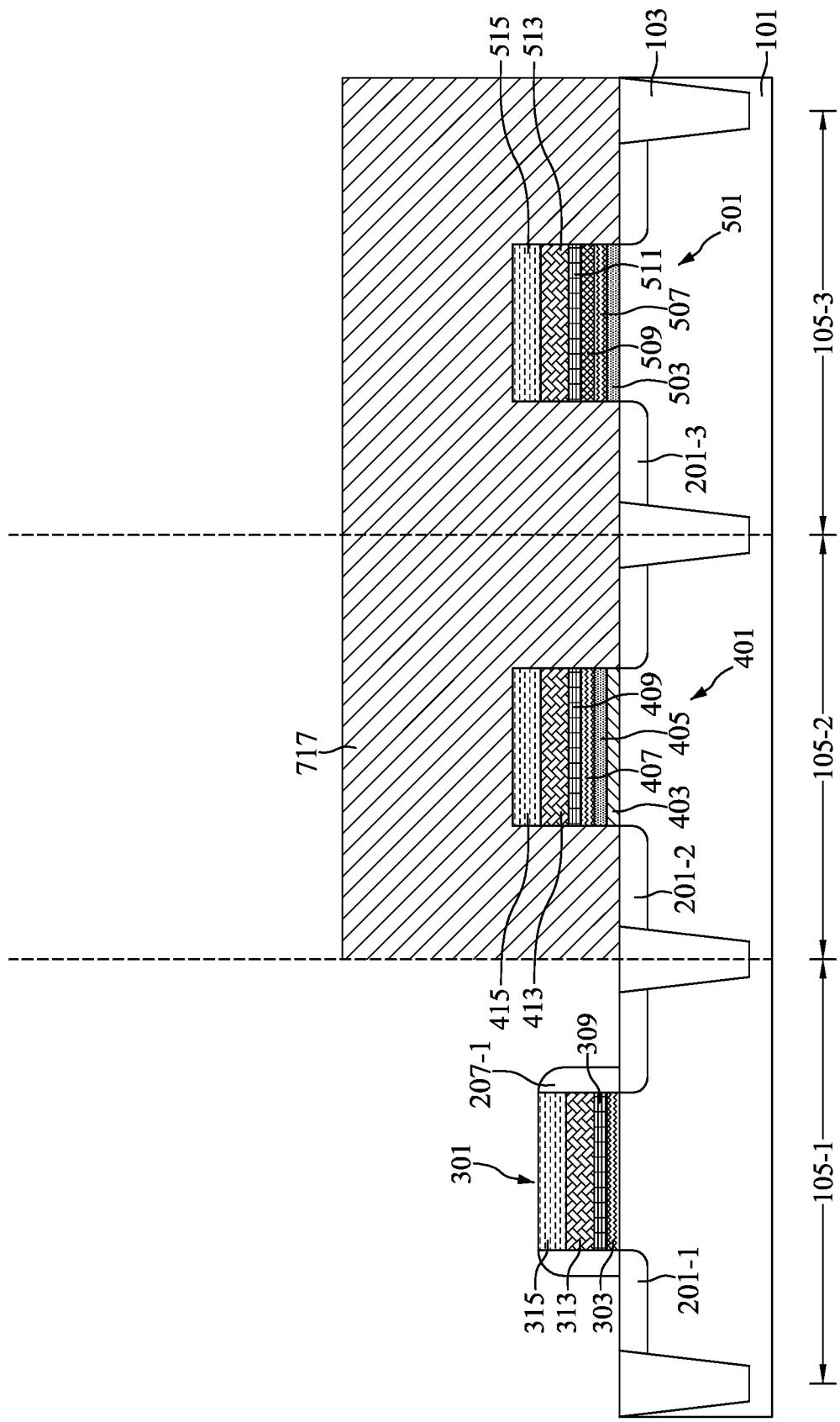
Figure 33:
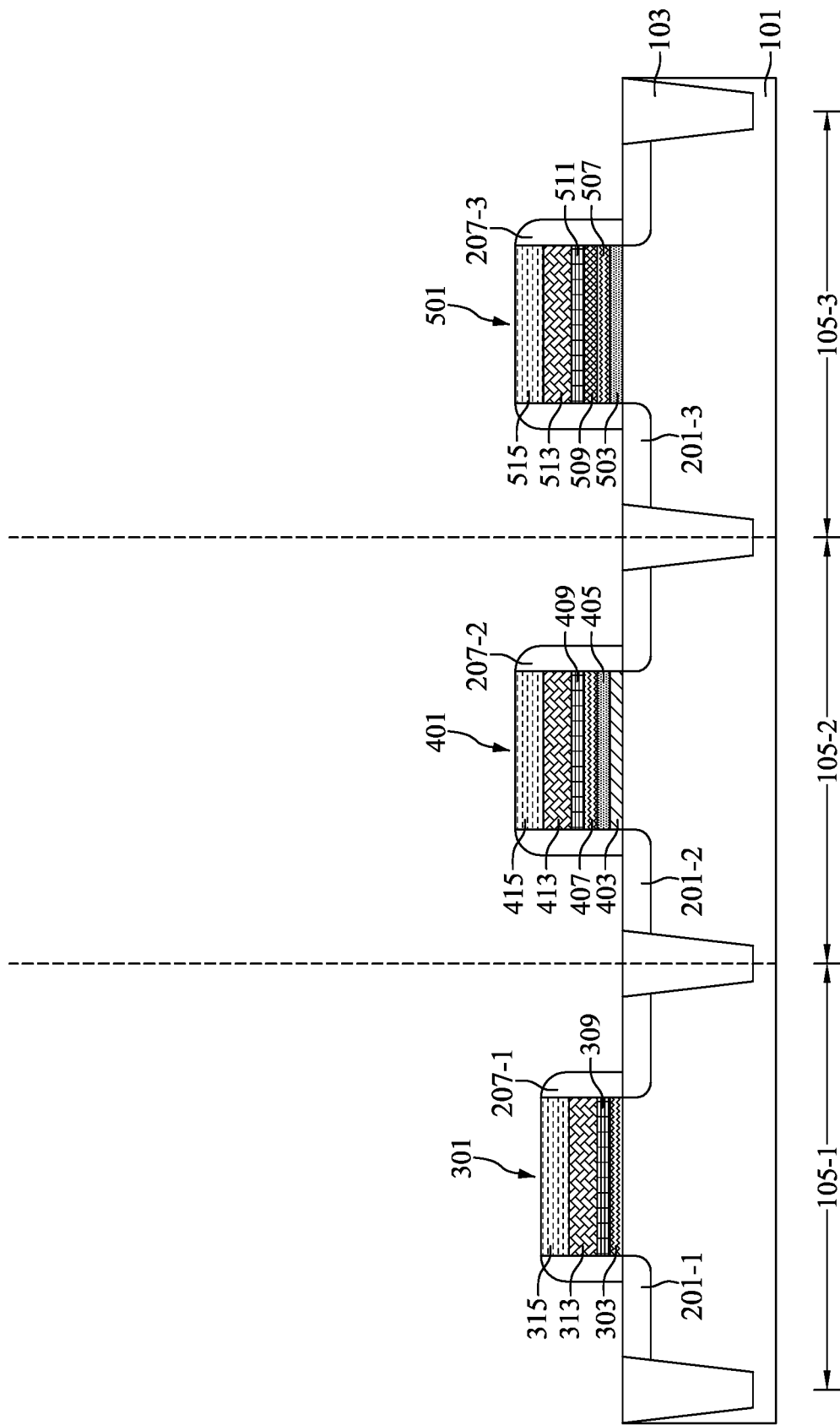

With reference to FIGS. 12 and 31 to 33, at step S19, in the embodiment depicted, a first pair of inner spacers 207-1, a second pair of inner spacers 207-2, and a third pair of inner spacers 207-3 may be respectively correspondingly formed on the first active region 105-1, the second active region 105-2, and the third active region 105-3. With reference to FIG. 31, a mask layer may be formed over the substrate 101. After development, the mask layer may be turned into a ninth mask segment 717 cover the second active region 105-2 and the third active region 105-3. Subsequently, a spacer film 615 may be deposited on the first active region 105-1 and may cover the first semiconductor stack 301. The spacer film 615 may be formed of, for example, polysilicon, silicon oxide, or silicon nitride. With reference to FIG. 32, an etch process, such as an anisotropic dry etch process, may be performed to remove portions of the spacer film 615 and turn the spacer film 615 into the first pair of inner spacers 207-1 attached to two sides of the first semiconductor stack 301. With reference to FIG. 33, the second pair of inner spacers 207-2 and the third pair of inner spacers 207-3 may be respectively correspondingly formed on the second active region 105-2 and the third active region 105-3 with a procedure similar to that of the first pair of inner spacers 207-1 illustrated in FIGS. 30 and 31. Subsequently, the ninth mask segment 717 may be removed.

Figure 34:
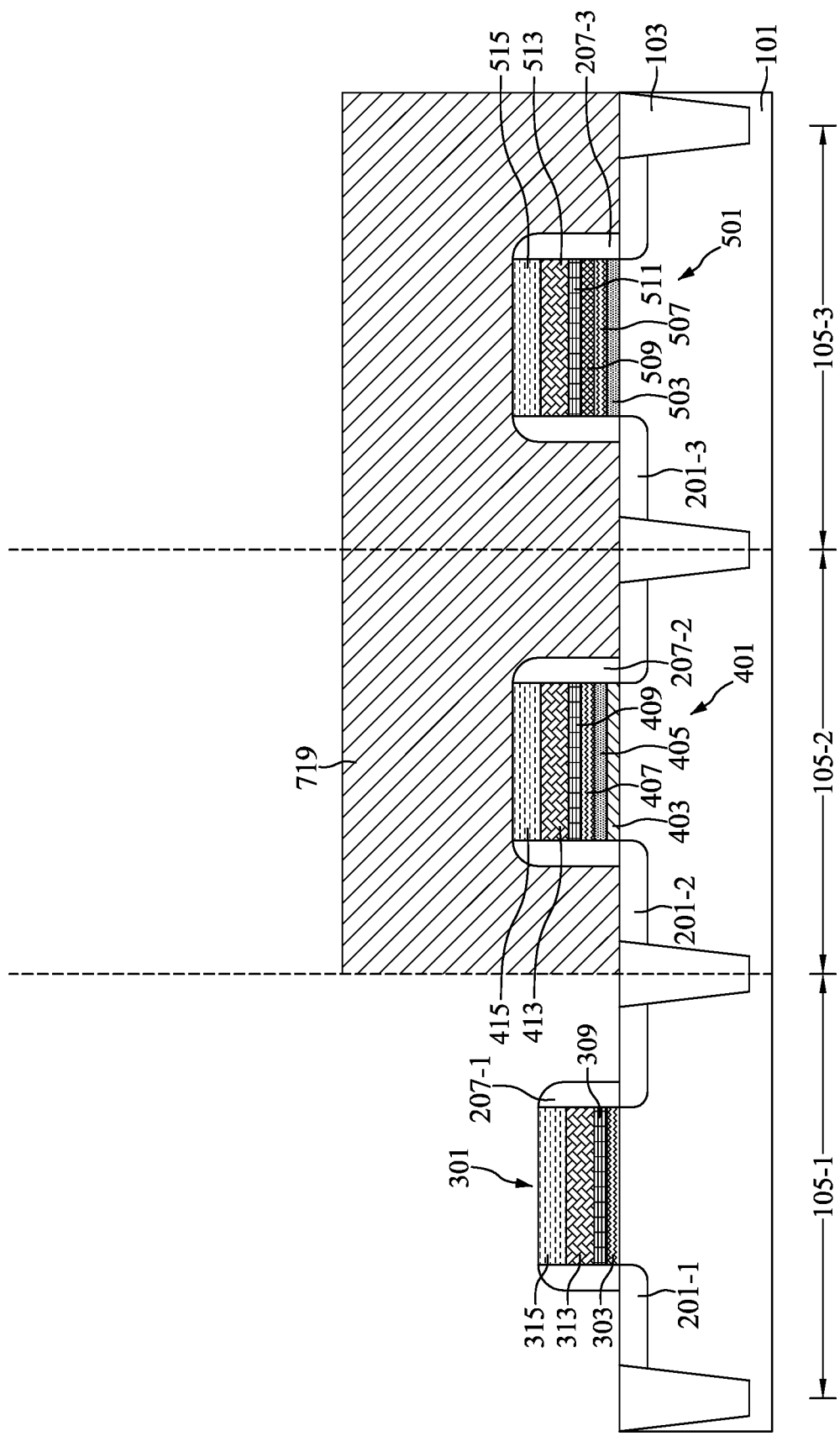
Figure 35:
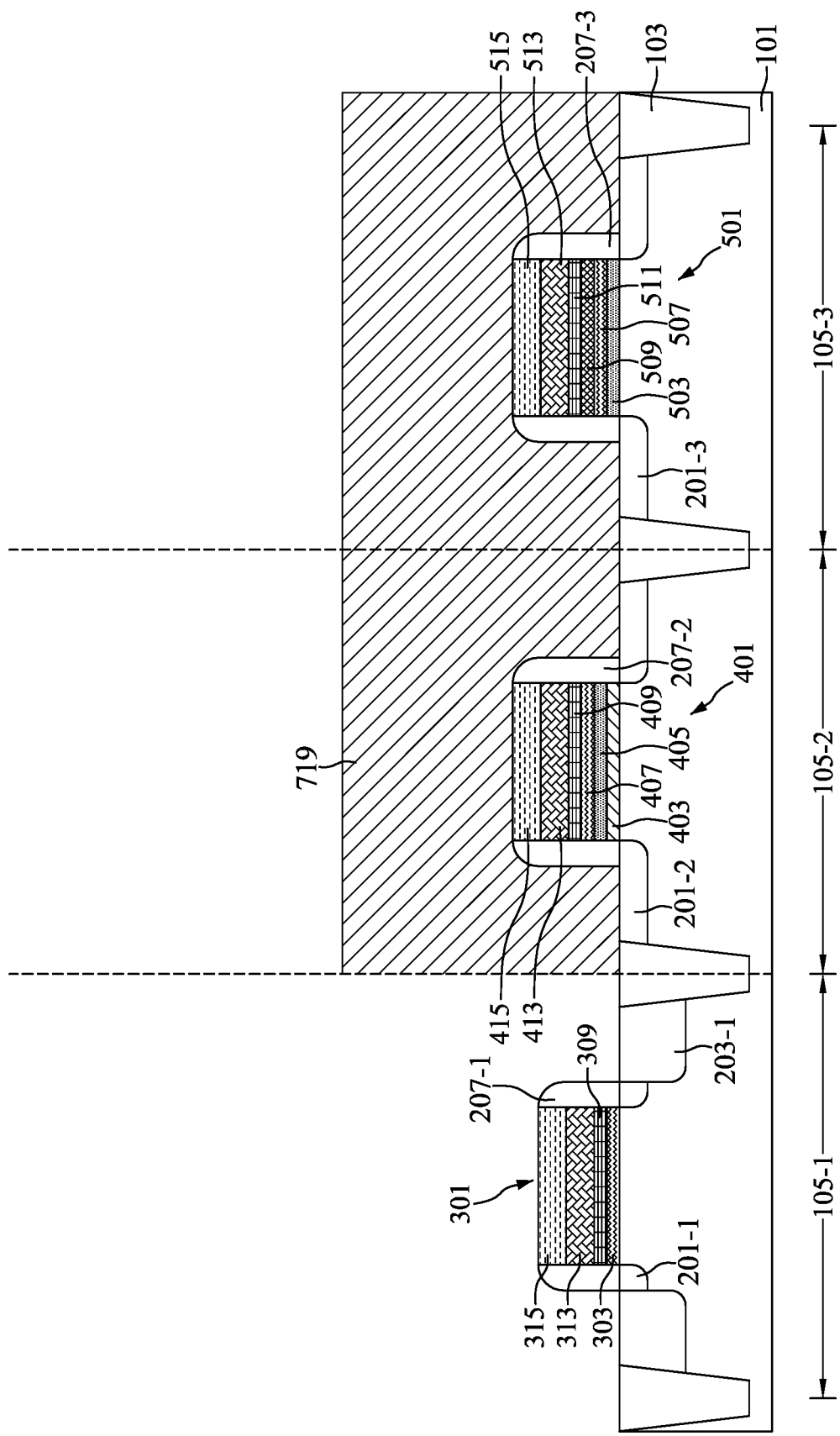
Figure 36:
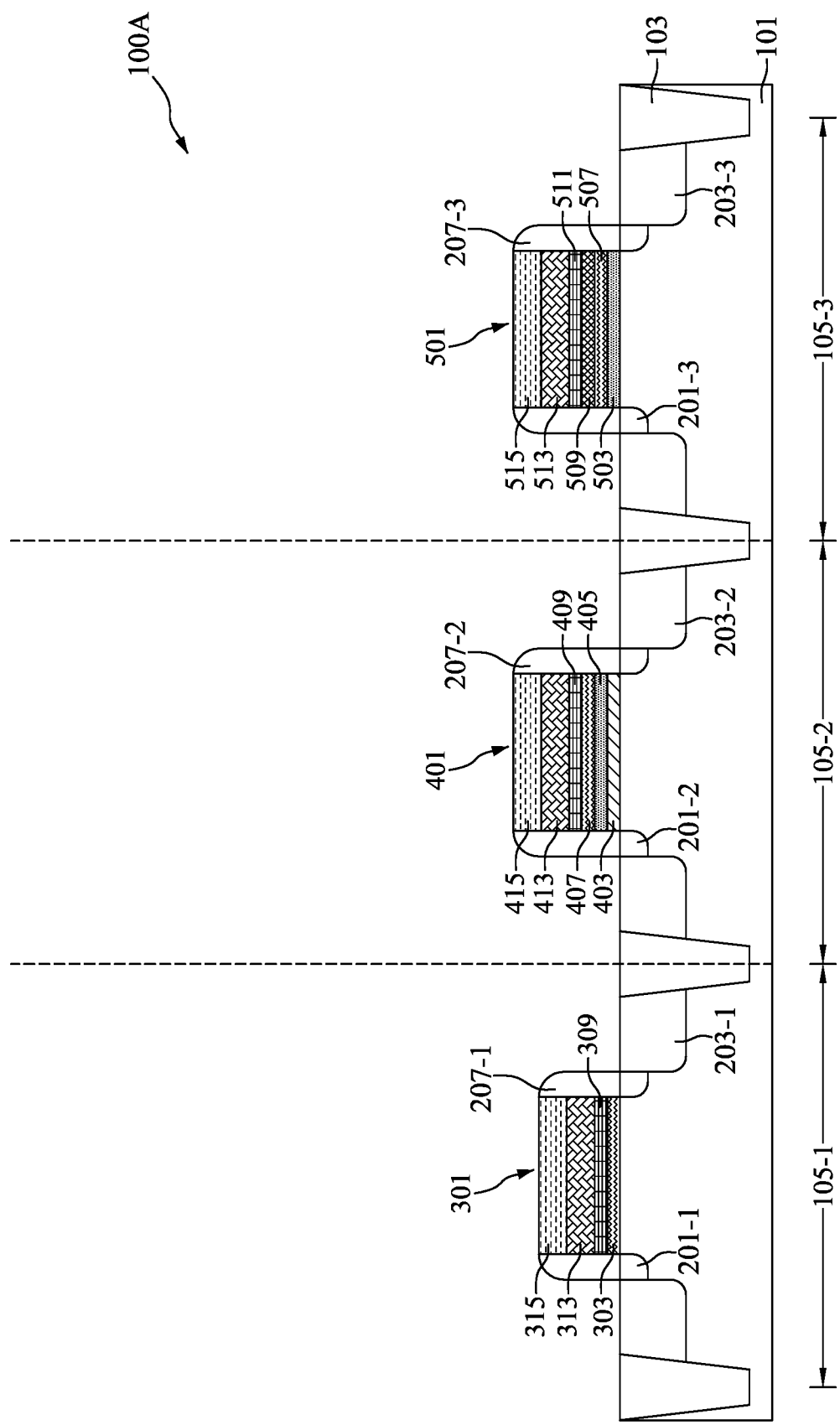

With reference to FIGS. 12 and 34 to 36, at step S21, in the embodiment depicted, two first heavily-doped regions 203-1, two second heavily-doped regions 203-2, and two third heavily-doped regions 203-3 may be respectively correspondingly formed in the first active region 105-1, the second active region 105-2, and the third active region 105-3. With reference to FIG. 34, a mask layer may be formed over the substrate 101. After development, the mask layer may be turned into a tenth mask segment 719 covering the second active region 105-2 and the third active region 105-3. With reference to FIG. 35, an implantation process using a dopant such as phosphorus, arsenic, or antimony may be performed to respectively correspondingly form the two first heavily-doped regions 203-1 in the first active region 105-1. The tenth mask segment 719 may be removed after the implantation process. With reference to FIG. 36, the two second heavily-doped regions 203-2 and the two third heavily-doped regions 203-3 may be sequentially formed in the second active region 105-2 and the third active region 105-3 with other implantation processes similar to that of the two first heavily-doped regions 203-1 illustrated in FIGS. 34 and 35.

Due to the design of the semiconductor device of the present disclosure, the first semiconductor stack 301, the second semiconductor stack 401, and the third semiconductor stack 501 may have different threshold voltages and may provide different functions; therefore, the applicability of the semiconductor device may be increased. In addition, the carrier mobility of the semiconductor device may be improved due to presence of the pairs of stress regions. Furthermore, the threshold voltages of the semiconductor device may be fine-tuned using the adjustment layers.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor device, comprising:
a substrate;
a first semiconductor stack having a first threshold voltage and comprising a first insulating stack positioned on the substrate;
a second semiconductor stack having a second threshold voltage and comprising a second insulating stack positioned on the substrate;
a third insulating stack; and
a third semiconductor stack having a third threshold voltage;
wherein the first threshold voltage is different from the second threshold voltage; a thickness of the first insulating stack is different from a thickness of the second insulating stack;
wherein the first insulating stack comprises a first bottom insulating layer positioned on the substrate and a first top conductive layer positioned above the first bottom insulating layer, wherein the first top conductive layer is made of material selected from a group consisting of aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride,
wherein the second insulating stack comprises a second bottom insulating layer positioned on the substrate, a second middle insulating layer positioned on the second bottom insulating layer, and a second top insulating layer positioned on the second middle insulating layer, a second bottom conductive layer positioned on the second top insulating layer, a second encapsulation layer positioned on the second bottom conductive layer,
wherein the third insulating stack comprises a third bottom insulating layer positioned on the substrate and a third top insulating layer positioned on the third bottom insulating layer,
wherein the third semiconductor stack comprises a third insulating stack positioned on the substrate; and the thickness of the second insulating stack is different from the thickness of the third insulating stack,
wherein the first semiconductor stack further comprises a first bottom conductive layer positioned between the first bottom insulating layer and the first top conductive layer.

2. The semiconductor device of claim 1, wherein the first top conductive layer has a thickness between 10 angstroms and 200 angstroms.

3. The semiconductor device of claim 2, wherein the first semiconductor stack further comprises a first filler layer positioned on the first top conductive layer, and the first filler layer is formed of tungsten or aluminum.

4. The semiconductor device of claim 3, wherein the second semiconductor stack further comprises a second top conductive layer positioned on the second bottom conductive layer.

5. The semiconductor device of claim 1, further comprising a first pair of inner spacers attached to two sides of the first semiconductor stack.

6. The semiconductor device of claim 5, further comprising a first pair of outer spacers attached to outer surfaces of the first pair of inner spacers.

7. The semiconductor device of claim 5, further comprising two first lightly-doped regions positioned adjacent to the first semiconductor stack and in the substrate.

8. The semiconductor device of claim 7, further comprising two first heavily-doped regions positioned adjacent to the first pair of inner spacers and in the substrate.

9. The semiconductor device of claim 1, further comprising a third pair of stress regions positioned adjacent to the third semiconductor stack, wherein lower portions of the third pair of stress regions are positioned in the substrate and upper portions of the third pair of stress regions protrude from a top surface of the substrate.

10. The semiconductor device of claim 1, wherein the second semiconductor stack further comprises a second functional layer positioned between the second top insulating layer and the second bottom conductive layer, and the second functional layer has a thickness between about 10 angstroms and about 15 angstroms.

11. The semiconductor device of claim 1, wherein the second encapsulation layer has a thickness between about 15 angstroms and about 25 angstroms.

12. A semiconductor device, comprising:
a substrate;
a first semiconductor stack having a first threshold voltage and comprising a first insulating stack positioned on the substrate; and
a second semiconductor stack having a second threshold voltage and comprising a second insulating stack positioned on the substrate,
wherein the first threshold voltage is different from the second threshold voltage; a thickness of the first insulating stack is different from a thickness of the second insulating stack;
wherein the first insulating stack comprises a first bottom insulating layer positioned on the substrate and a first top conductive layer positioned above the first bottom insulating layer, wherein the first top conductive layer is made of material selected from a group consisting of aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride,
wherein the second insulating stack comprises a second bottom insulating layer positioned on the substrate, a second middle insulating layer positioned on the second bottom insulating layer, and a second top insulating layer positioned on the second middle insulating layer, a second bottom conductive layer positioned on the second top insulating layer, a second encapsulation layer positioned on the second bottom conductive layer,
wherein the second semiconductor stack further comprises a second dipole layer positioned between the substrate and the second bottom insulating layer, and the second dipole layer is formed of a material including one or more of lutetium oxide, lutetium silicon oxide, yttrium oxide, yttrium silicon oxide, lanthanum oxide, lanthanum silicon oxide, barium oxide, and barium silicon oxide.

13. A semiconductor device, comprising:
a substrate;
a first semiconductor stack having a first threshold voltage and comprising a first insulating stack positioned on the substrate; and
a second semiconductor stack having a second threshold voltage and comprising a second insulating stack positioned on the substrate,
wherein the first threshold voltage is different from the second threshold voltage; a thickness of the first insulating stack is different from a thickness of the second insulating stack;
wherein the first insulating stack comprises a first bottom insulating layer positioned on the substrate and a first top conductive layer positioned above the first bottom insulating layer, wherein the first top conductive layer is made of material selected from a group consisting of aluminum, silver, titanium, titanium nitride, titanium aluminum, titanium carbide aluminum, titanium nitride aluminum, titanium silicon aluminum, tantalum nitride, tantalum carbide, tantalum silicon nitride, manganese, zirconium, or tungsten nitride,
wherein the second insulating stack comprises a second bottom insulating layer positioned on the substrate, a second middle insulating layer positioned on the second bottom insulating layer, and a second top insulating layer positioned on the second middle insulating layer, a second bottom conductive layer positioned on the second top insulating layer, a second encapsulation layer positioned on the second bottom conductive layer,
wherein the second semiconductor stack further comprises a second protection layer positioned between the second top insulating layer and the second bottom conductive layer, and the second protection layer is formed of titanium nitride.

* * * * *